(12) United States Patent
Chen et al.

(10) Patent No.: US 12,349,383 B2
(45) Date of Patent: Jul. 1, 2025

(54) ISOLATION STRUCTURES IN SEMICONDUCTOR DEVICES

(71) Applicant: Taiwan Semiconductor Manufacturing Company, Ltd., Hsinchu (TW)

(72) Inventors: Jian-Shian Chen, Hsinchu (TW); Ru-Shang Hsiao, Jhubei (TW)

(73) Assignee: Taiwan Semiconductor Manufacturing Company, Ltd.

( * ) Notice: Subject to any disclaimer, the term of this patent is extended or adjusted under 35 U.S.C. 154(b) by 392 days.

(21) Appl. No.: 17/738,955

(22) Filed: May 6, 2022

(65) Prior Publication Data

US 2022/0406917 A1 Dec. 22, 2022

Related U.S. Application Data

(60) Provisional application No. 63/211,894, filed on Jun. 17, 2021.

(51) Int. Cl.
| | |
|---|---|
| *H10D 30/01* | (2025.01) |
| *H10D 64/01* | (2025.01) |
| *H10D 84/01* | (2025.01) |
| *H10D 84/03* | (2025.01) |
| *H10D 84/83* | (2025.01) |

(52) U.S. Cl.
CPC ....... *H10D 30/0243* (2025.01); *H10D 64/017* (2025.01); *H10D 84/0151* (2025.01); *H10D 84/0158* (2025.01); *H10D 84/038* (2025.01); *H10D 84/834* (2025.01)

(58) Field of Classification Search
None
See application file for complete search history.

(56) References Cited

U.S. PATENT DOCUMENTS

| | | | |
|---|---|---|---|
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,520,482 B1 | 12/2016 | Chang et al. | |
| 9,548,303 B2 | 1/2017 | Lee et al. | |
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 9,905,473 B1 * | 2/2018 | Bouche | H01L 21/823418 |
| 2014/0306297 A1 * | 10/2014 | Ching | H01L 29/66545 |
| | | | 438/283 |
| 2021/0343600 A1 * | 11/2021 | Chen | H01L 29/78696 |
| 2022/0270929 A1 * | 8/2022 | Chen | H01L 21/7682 |

* cited by examiner

*Primary Examiner* — Michelle Mandala
(74) *Attorney, Agent, or Firm* — Sterne, Kessler, Goldstein & Fox P.L.L.C.

(57) ABSTRACT

A semiconductor device with different isolation structures and a method of fabricating the same are disclosed. The a method includes forming first and second fin structures on a substrate, forming a dummy fin structure on the substrate and between the first and second fin structures, forming a polysilicon structure on the dummy fin structure, forming source/drain regions on the first and second fin structures, and replacing the polysilicon structure with a dummy gate structure. A top portion of the dummy gate structure is formed wider than a bottom portion of the dummy gate structure.

20 Claims, 20 Drawing Sheets

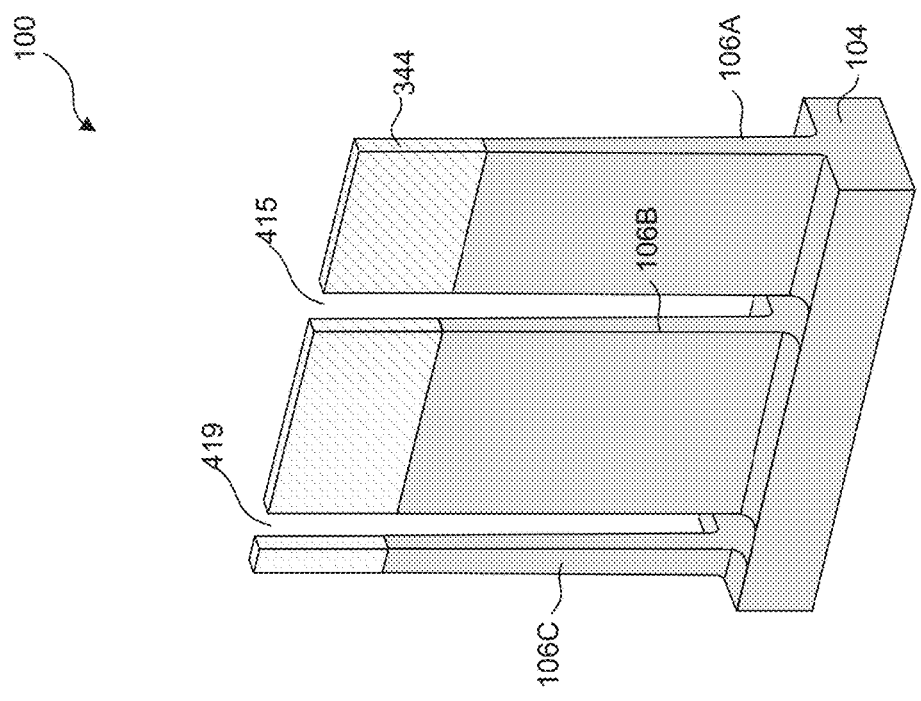
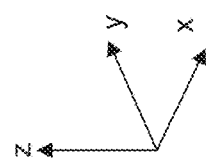
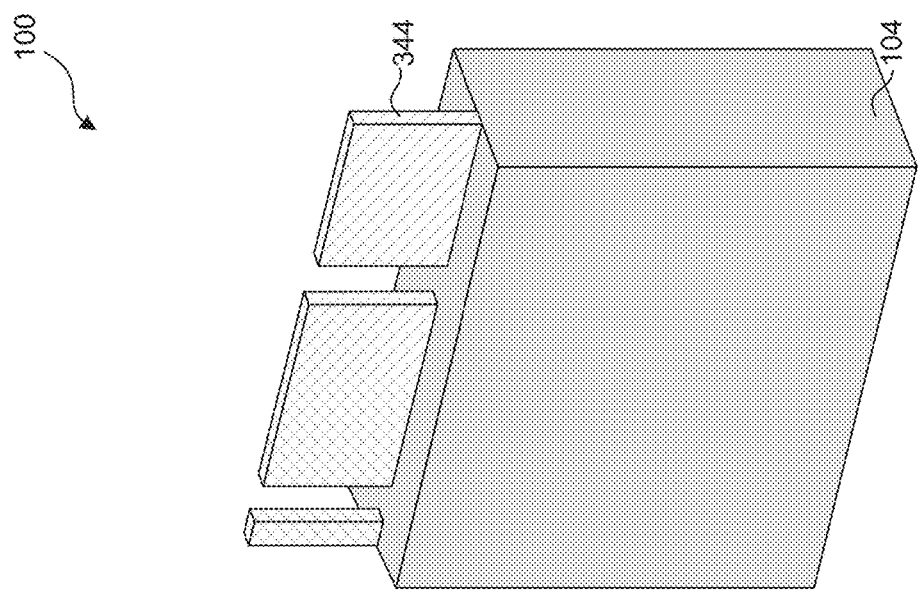
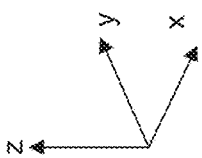

ISOLATION STRUCTURES IN SEMICONDUCTOR DEVICES

CROSS-REFERENCE TO RELATED APPLICATIONS

This application claims the benefit of U.S. Provisional Patent Application No. 63/211,894, titled "Gate Structures in Semiconductor Devices," filed Jun. 17, 2021, the disclosure of which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures.

FIGS. 3-20 illustrate isometric views and cross-sectional views of a semiconductor device with isolation structures at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
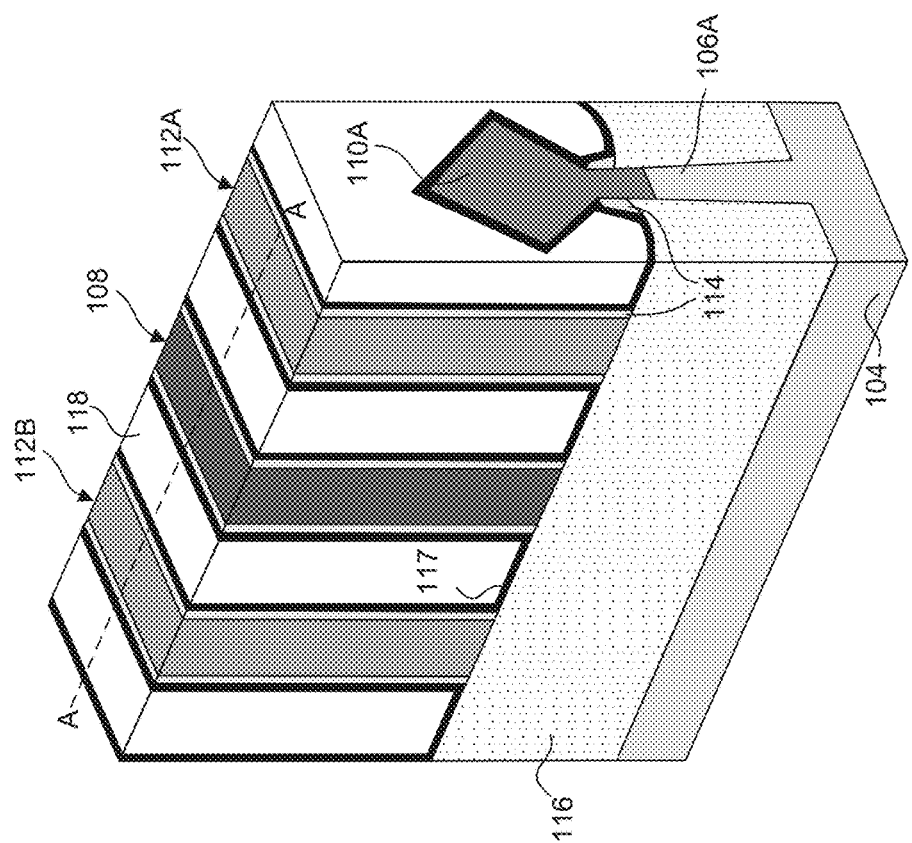
FIG. 1A illustrates an isometric view of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The present disclosure provides example structures of FETs (e.g., finFETs or MOSFETs) with different isolation structures and example methods of forming the same. In some embodiments, a FET includes active fin structures, active gate structures on the active fin structures, and isolation structures configured to electrically isolate the active fin structures. In some embodiments, an isolation structure includes a dummy fin structure and a dummy gate structure on the dummy fin structure. The dummy fin structure includes a dielectric material and is interposed between active fin structures. The dummy gate structure includes a gate stack similar to the gate stacks of the active gate structures and a portion of the dummy gate structure extends into the dummy fin structure. The extended portion of the dummy gate structure can prevent the dummy fin structure from being etched during processing of adjacent structures, such as contact structures. In some embodiments, the dummy gate structure is formed with a gate length that is greater than the width of the dummy fin structure to prevent misalignment between the dummy gate structure and the dummy fin structure. Preventing misalignment between the dummy gate structure and the dummy fin structure can prevent the metal gate stack of the dummy gate structure from being exposed and forming an electrical short between the metal gate stack and adjacent structures, such as source/drain regions of the FET. In some embodiments, to prevent the misalignment, the dummy gate structure is formed with a gate length that is about 1.1 times to about 1.5 times the width of the dummy fin structure.

Figure 1B:
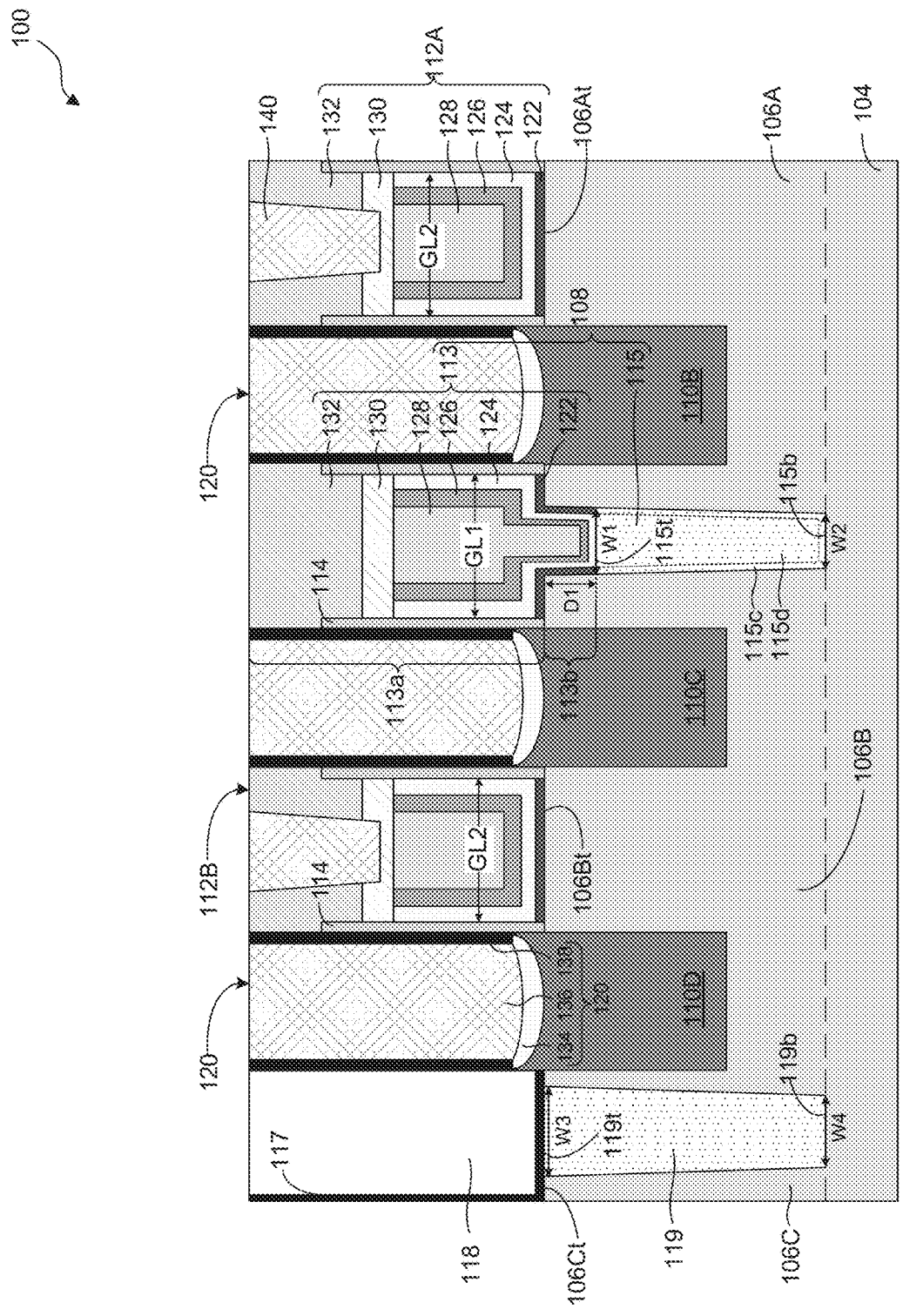
FIG. 1B-1C illustrate cross-sectional views of a semiconductor device with isolation structures, in accordance with some embodiments.
Figure 1C:
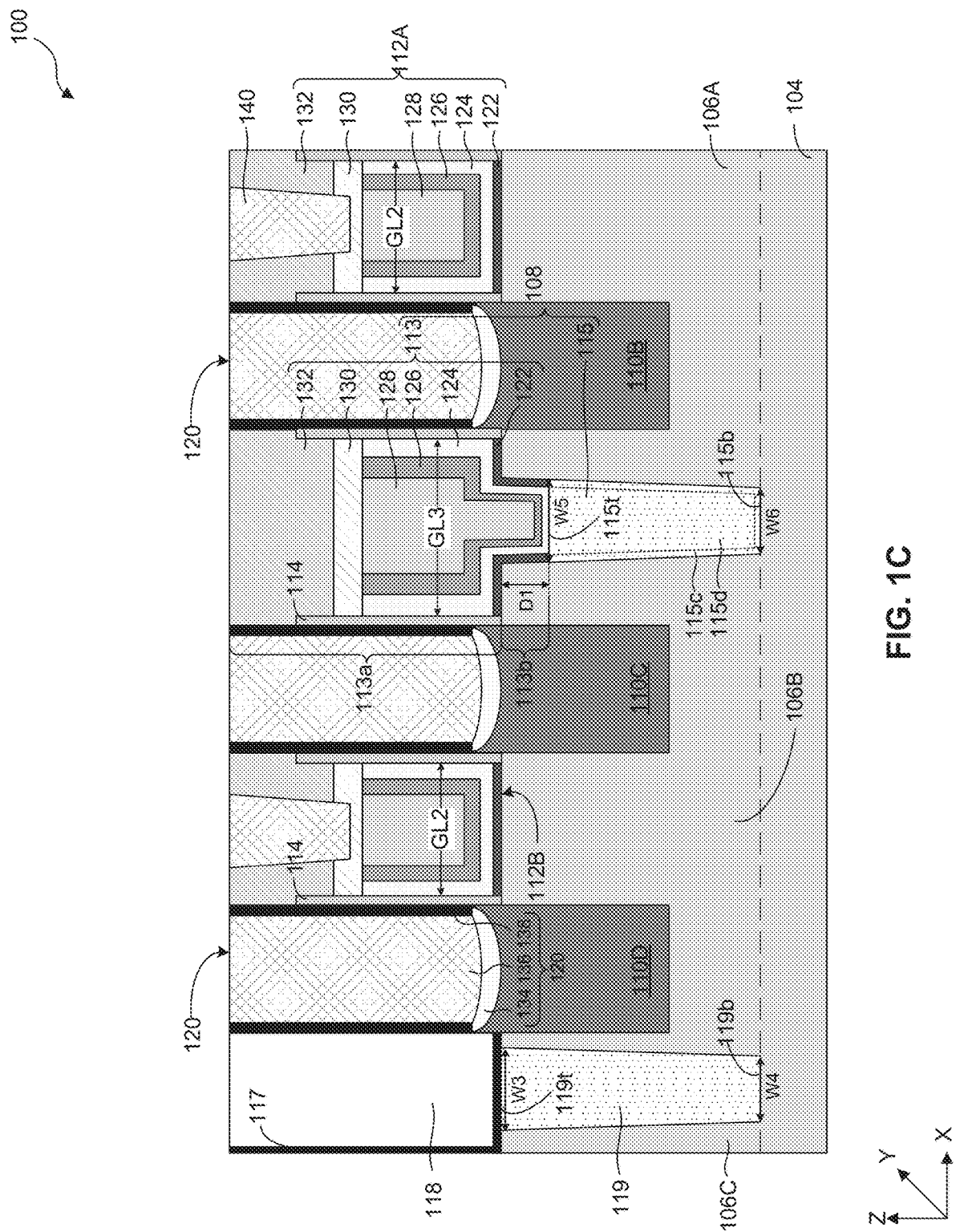

FIG. 1A illustrates an isometric view of a FET 100, according to some embodiments. FIGS. 1B and 1C illustrate different cross-sectional views of FET 100, along line A-A of FIG. 1A, according to some embodiments. FIGS. 1B and 1C illustrate cross-sectional views of FET 100 with additional structures that are not shown in FIG. 1A for simplicity. The discussion of elements with the same annotations applies to each other, unless mentioned otherwise. In some embodiments, FET 100 can represent n-type finFET 100 (NFET 100) or p-type finFET 100 (PFET 100) and the discussion of FET 100 applies to both NFET 100 and PFET 100, unless mentioned otherwise.

Referring to FIGS. 1A and 1B, FET 100 can include an array of fin structures 106A, 106B, and 106C (also referred to as "active fin structures 106A, 106B, and 106C") disposed on substrate 104. In some embodiments, FET 100 can further include an array of gate structures 112A and 112B (also referred to as "active gate structures 112A and 112B") disposed on fin structures 106A and 106B, respectively, and an array of S/D regions 110A, 110B, 110C, and 110D (S/D region 110A visible in FIG. 1A, and S/D regions 110B, 110C, and 110D visible in FIG. 1B). S/D regions 110A and 110B can be disposed in a portion of fin structure 106A that is not covered by gate structure 112A. Similarly, S/D regions 110C and 110D can be disposed in a portion of fin structure 106B that is not covered by gate structure 112B. In some embodiments, FET 100 can further include S/D contact structures 120 disposed on S/D regions 110A, 110B, 110C, and 110D (not shown on S/D 110A for simplicity), and gate contact structure 140 disposed on gate structures 112A and 112B. In some embodiments, fin structure 106A, 106B, and 106C, and gate structures 112A and 112B are electrically active and can be electrically coupled to power supplies through contact structures, such as S/D contact structures 120 and gate contact structures 140.

In some embodiments, FET 100 can further include isolation structures 108 and 119. Isolation structures 108 and 119 are electrically inactive structures and are not electrically coupled to any power supplies and are electrically isolated from other structures of FET 100. In some embodiments, isolation structure 108 can be disposed between S/D regions 110B and 110C, and between gate structures 112A and 112B. In some embodiments, isolation structure 119 can be disposed between fin structures 106B and 106C.

In some embodiments, FET 100 can further include gate spacers 114, shallow trench isolation (STI) regions 116, etch stop layer (ESL) 117, and interlayer dielectric (ILD) layer 118. ILD layer 118 can be disposed on ESL 117. ESL 117 can be configured to protect gate structures 112A and 112B and/or S/D regions 110A, 110B, 110C, and 110D during processing of FET 100. In some embodiments, gate spacers 114, STI regions 116, ESL 117, and ILD layer 118 can include an insulating material, such as silicon oxide, silicon nitride (SiN), silicon carbon nitride (SiCN), and silicon oxycarbon nitride (SiOCN).

FET 100 can be formed on a substrate 104. There may be other FETs and/or structures (e.g., isolation structures) formed on substrate 104. Substrate 104 can be a semiconductor material, such as silicon, germanium (Ge), silicon germanium (SiGe), a silicon-on-insulator (SOI) structure, and a combination thereof. Further, substrate 104 can be doped with p-type dopants (e.g., boron, indium, aluminum, or gallium) or n-type dopants (e.g., phosphorus or arsenic). In some embodiments, fin structures 106A, 106B, and 106C can include a material similar to substrate 104 and extend along an X-axis.

In some embodiments, for NFET 100, each of S/D regions 110A, 110B, 110C, and 110D can include an epitaxially-grown semiconductor material, such as Si, and n-type dopants, such as phosphorus and other suitable n-type dopants. In some embodiments, for PFET 100, each of S/D regions 110A, 110B, 110C, and 110D can include an epitaxially-grown semiconductor material, such as Si and SiGe, and p-type dopants, such as boron and other suitable p-type dopants. In some embodiments, S/D regions 110A and 110B can be of opposite conductivity type than S/D regions 110C and 110D.

In some embodiments, S/D contact structures 120 can include silicide layers 134 disposed on S/D regions 110A, 110B, 110C, and 110D, contact plugs 136 disposed on silicide layers 134, and nitride barrier layers 138 along sidewalls of contact plugs 136. In some embodiments, silicide layers 134 can include titanium silicide ($Ti_xSi_y$), tantalum silicide ($Ta_xSi$), molybdenum silicide ($Mo_xSi_y$), nickel silicide ($Ni_xSi_y$), cobalt silicide ($Co_xSi_y$), tungsten silicide ($W_xSi_y$), or a combination thereof. In some embodiments, contact plugs 136 can include conductive materials, such as cobalt (Co), tungsten (W), ruthenium (Ru), iridium (Ir), nickel (Ni), osmium (Os), rhodium (Rh), aluminum (Al), molybdenum (Mo), copper (Cu), zirconium (Zr), stannum (Sn), silver (Ag), gold (Au), zinc (Zn), cadmium (Cd), and a combination thereof. In some embodiments, S/D contact structures 120 can electrically connect to overlying interconnect structures (not shown), power supplies (not shown), and/or other elements of FET 100 and/or IC and provide electrical conduction to S/D region 110A, 110B, 110C, and 110D through S/D contact structures 120.

Gate structures 112A and 112B can be multi-layered structures. In some embodiments, each of gate structures 112A and 112B can include interfacial oxide (IO) layers 122, high-k (HK) gate dielectric layers 124 disposed on IO layers 122, work function metal (WFM) layers 126 disposed on HK gate dielectric layers 124, gate metal fill layers 128 disposed on WFM layers 126, conductive capping layers 130 disposed on HK gate dielectric layers 124, WFM layers 126, and gate metal fill layers 128, and insulating capping layers 132 disposed on conductive capping layers 130. In some embodiments, the stacks of WFM layers 126 and gate metal fill layers 128 can be referred to as "metal gate stacks" of gate structures 112A and 112B.

In some embodiments, IO layers 122 can include silicon oxide ($SiO_2$), silicon germanium oxide ($SiGeO_x$), or germanium oxide ($GeO_x$) and can have a thickness of about 0.5 nm to about 2 nm. In some embodiments, HK gate dielectric layers 124 can include a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$) can have a thickness of about 0.5 nm to about 4 nm. Within these thickness ranges of IO layers 122 and HK gate dielectric layers 124, adequate electrical isolation between gate structures 112A-112B and channel regions in fin structures 106A-106B can be provided without compromising device size and manufacturing cost.

In some embodiments, WFM layers 126 of NFET gate structures 112A and 112B can include titanium aluminum (TiAl), titanium aluminum carbide (TiAlC), tantalum aluminum (TaAl), tantalum aluminum carbide (TaAlC), Al-doped Ti, Al-doped TiN, Al-doped Ta, Al-doped TaN, other suitable Al-based materials, or a combination thereof. In some embodiments, WFM layers 126 of PFET gate structures 112A and 112B can include substantially Al-free (e.g., with no Al) Ti-based or Ta-based nitrides or alloys, such as titanium nitride (TiN), titanium silicon nitride (TiSiN), titanium gold (Ti—Au) alloy, titanium copper (Ti—Cu) alloy, tantalum nitride (TaN), tantalum silicon nitride (TaSiN), tantalum gold (Ta—Au) alloy, tantalum copper (Ta—Cu), and a combination thereof. In some embodiments, gate metal fill layers 128 can include a suitable conductive material, such as tungsten (W), Ti, silver (Ag), ruthenium (Ru), molybdenum (Mo), copper (Cu), cobalt (Co), Al, iridium (Ir), nickel (Ni), metal alloys, and a combination thereof.

Insulating capping layers 132 protects the underlying conductive capping layers 130 from structural and/or compositional degradation during subsequent processing of the semiconductor device. In some embodiments, insulating capping layer 132 can include a nitride material, such as silicon nitride, and can have a thickness of about 5 nm to about 10 nm for adequate protection of the underlying conductive capping layer 130. Conductive capping layers 130 provide conductive interfaces between gate metal fill layers 128 and gate contact structures 140 to electrically connect the metal gate stacks of gate structures 112A and 112B to gate contact structures 140 without forming gate contact structures 140 directly on or within the metal gate stacks. Gate contact structures 140 are not formed directly on or within the metal gate stacks to prevent contamination of the metal gate stacks by any of the processing materials used in the formation of gate contact structures 140. Contamination of the metal gate stacks can lead to the degradation of device performance. Thus, with the use of conductive capping layers 130, the metal gate stacks can be electrically connected to gate contact structures 140 without compromising the integrity of gate structures 112A and 112B. In some embodiments, conductive capping layers 130 and gate contact structures 140 can include a metallic material, such as W, Ru, Ir, Mo, other suitable metallic materials, and a combination thereof. In some embodiments, conductive capping layers 130 and gate contact structures 140 can have the same metallic material or can have metallic materials different from each other. In some embodiments, for adequate conductive interface between the metal gate stacks and gate contact structures 140, a ratio between a thickness of conductive capping layer 130 and a thickness of the metal gate stack can range from about 1:2 to about 1:4. In some embodiments, for adequate protection of the underlying conductive capping layer 130, a ratio between the thickness of conductive capping layer 130 and a thickness of insulating capping layer 132 can range from about 1:1 to about 1:2.

In some embodiments, isolation structure 108 can be configured to electrically isolate fin structure 106A from fin structure 106B, S/D regions 110A-110B from S/D regions 110C-110D, and/or gate structure 112A from gate structure 112B. In some embodiments, isolation structure 108 can include a dummy fin structure 115 (also referred to as a "dielectric fin structure 115") disposed between fin structures 106A and 106B. Dummy fin structure 115 is electrically inactive and is not electrically coupled to any power supplies. In some embodiments, top surface 115t of dummy fin structure 115 can be non-coplanar with top surfaces 106At, 106Bt, and/or 106Ct of fin structures 106A, 106B, and 106C. In some embodiments, top surface 115t can be at a surface plane that is lower than that of top surfaces 106At, 106Bt, and/or 106Ct. In some embodiments, top surface 115t can be lower than top surfaces 106At, 106Bt, and/or 106Ct by a vertical dimension D1 of about 1 nm to about 10 nm, along a Z-axis. In some embodiments, dummy fin structure 115 can have a tapered structure with top surface 115t having a width W1 greater than a width W2 of a bottom surface 115b. In some embodiments, a ratio (W1:W2) between widths W1 and W2 can be about 1:1.1 to about 1:1.5 to electrically isolate fin structure 106A from fin structure 106B, S/D regions 110A-110B from S/D regions 110C-110D, and/or gate structure 112A from gate structure 112B.

In some embodiments, dummy fin structure 115 can include one or more layers of dielectric material, such as silicon oxide, silicon oxycarbide (SiOC), silicon nitride (SiN), silicon carbon nitride (SiCN), and silicon oxycarbon nitride (SiOCN). In some embodiments, dummy fin structure 115 can include a bi-layer dielectric stack of a nitride liner 115ac and an oxide fill layer 115d. Nitride liner 115c can include silicon nitride or silicon nitride-based material and oxide fill layer 115d can include silicon oxide or silicon oxide-based material (e.g., silicon oxycarbide). Since oxide fill layer 115d has a lower dielectric constant (e.g., about 3.9) than nitride liner 115c (e.g., about 6.5 to about 8) and the volumes occupied by oxide fill layer 115d in dummy fin structure 115 is larger than that occupied by nitride liner 115c, the resulting dielectric constant of dummy fin structure 115 is closer to the dielectric constant of oxide fill layer 115d (e.g., about 4 to about 6). Thus, the impact on the parasitic capacitances from dummy fin structure 115 is reduced compared to isolation structures with only silicon nitride fill. In some embodiments, a thickness ratio between nitride liner 115c and oxide fill layer 115d can be between about 1:4 and about 1:10 to achieve a dielectric constant of about 4 to about 6 for dummy fin structure 115. In some embodiments, dummy fin structure 115 and STI regions 116 can have the same one or more layers of dielectric material.

In some embodiments, isolation structure 108 can further include a dummy gate structure 113 with a top gate portion 113a and a bottom gate portion 113b. Dummy gate structure 113 is electrically inactive and is not electrically coupled to any power supplies. Top gate portion 113a can be disposed on and in physical contact with top surfaces 106At and 106Bt of fin structures 106A and 106B. Bottom gate portion 113b can be disposed on and in physical contact with top surface 115t of dummy fin structure 115. In some embodiments, bottom gate portion 113b can extend below top surfaces 106At and/or 106Bt by vertical dimension D1 of about 1 nm to about 10 nm, along a Z-axis. In some embodiments, top gate portion 113a can have a gate length GL1 greater than width W1 of bottom gate portion 113b and top surface 115t of dummy fin structure 115. The wider top gate portion 113a than bottom gate portion 113b and top surface 115t can prevent and/or minimize misalignments between dummy gate structure 113 and dummy fin structure 115 and/or between top gate portion 113a and bottom gate portion 113b during the formation of isolation structure 108.

These misalignments may be present if top gate portion 113a is substantially equal to bottom gate portion 113b and top surface 115t. If these misalignments are present, isolation structure 108 can be formed with dummy fin structure 115 partially uncovered by dummy gate structure 113 and/or bottom gate portion 113b partially uncovered by top gate portion 113a and gate spacers 114. The partially uncovered dummy fin structure 115 can be damaged during subsequent processing of FET 100 and the partially uncovered bottom gate portion 113b can form an electrical short with adjacent S/D regions 110B and/or 110C and/or with adjacent S/D contact structures 120. Thus, better electrical isolation and device performance can be provided by isolation structure 108 with top gate portion 113a wider than the width of dummy fin structure 115 and bottom gate portion 113b. In some embodiments, a ratio (GL1:W1) between gate length GL1 and width W1 can be about 1:1.1 to about 1:1.5 to adequately prevent and/or minimize misalignments between dummy gate structure 113 and dummy fin structure 115 and/or between top gate portion 113a and bottom gate portion 113b during the formation of isolation structure 108.

In some embodiments, similar to gate structures 112A-112B, dummy gate structure 113 can include IO layer 122, HK gate dielectric layer 124, WFM layer 126, gate metal fill layer 128, conductive capping layer 130, and insulating capping layer 132. IO layer 122 of dummy gate structure 113 can be disposed on top surfaces 106At and 106Bt and along sidewalls of fin structures 106A-106B. A portion of HK gate dielectric layer 124 of dummy gate structure 113 can be disposed on and in physical contact with top surface 115t of dummy fin structure 115. In some embodiments, portions of HK gate dielectric layer 124, WFM layer 126, and gate metal fill layer 128 of dummy gate structure 113 extends below top surfaces 106At and/or 106Bt.

In some embodiments, isolation structure 119 (also referred to as a "dummy fin structure 119") can be configured to electrically isolate fin structure 106C and/or active FET elements (not shown) on fin structure 106C from fin structure 106B, from S/D regions 110C and 110D, and/or gate structure 112B. Dummy fin structure 119 is electrically inactive and is not electrically coupled to any power supplies. In some embodiments, top surface 119t of dummy fin structure 119 can be substantially coplanar with top surfaces 106At, 106Bt, and/or 106Ct of fin structures 106A, 106B, and 106C. In some embodiments, top surface 119t of dummy fin structure 119 can be non-coplanar with top surface 115t of dummy fin structure 115. In some embodiments, top surface 115t can be lower than top surfaces 119t by vertical dimension D1 of about 1 nm to about 10 nm, along a Z-axis. In some embodiments, dummy fin structure 119 can have a tapered structure with top surface 119t having a width W3 greater than a width W4 of a bottom surface 119b. In some embodiments, a ratio (W3:W42) between widths W3 and W4 can be about 1:1.1 to about 1:1.5 to electrically isolate fin structure 106C and/or active FET elements on fin structure 106C from fin structure 106B, from S/D regions 110C and 110D, and/or gate structure 112B. In some embodiments, dummy fin structure 119 can have the same one or more layers of dielectric material or the bi-layer dielectric stack of dummy fin structure 115, as described above.

In some embodiments, when gate length GL1 of dummy gate structure 113 is substantially equal to gate lengths GL2 of gate structures 112A and 112B, as shown in FIG. 1B, dummy fin structure 115 is formed with widths W1 and W2 smaller than widths W3 and W4, respectively, of dummy fin structure 119 to maintain the ratio (GL1:W1) between gate length GL1 and width W1 of about 1:1.1 to about 1:1.5.

In some embodiments, when dummy fin structure 115 is formed with widths W1 and W2 substantially equal to widths W3 and W4, respectively, of dummy fin structure 119, as shown in FIG. 1C, dummy gate structure 113 is formed with gate length GL1 about 1.1 times to about 1:1.3 times greater than gate lengths GL2 of gate structures 112A and 112B to maintain the ratio (GL1:W1) between gate length GL1 and width W1 of about 1:1.1 to about 1:1.5.

Figure 2:
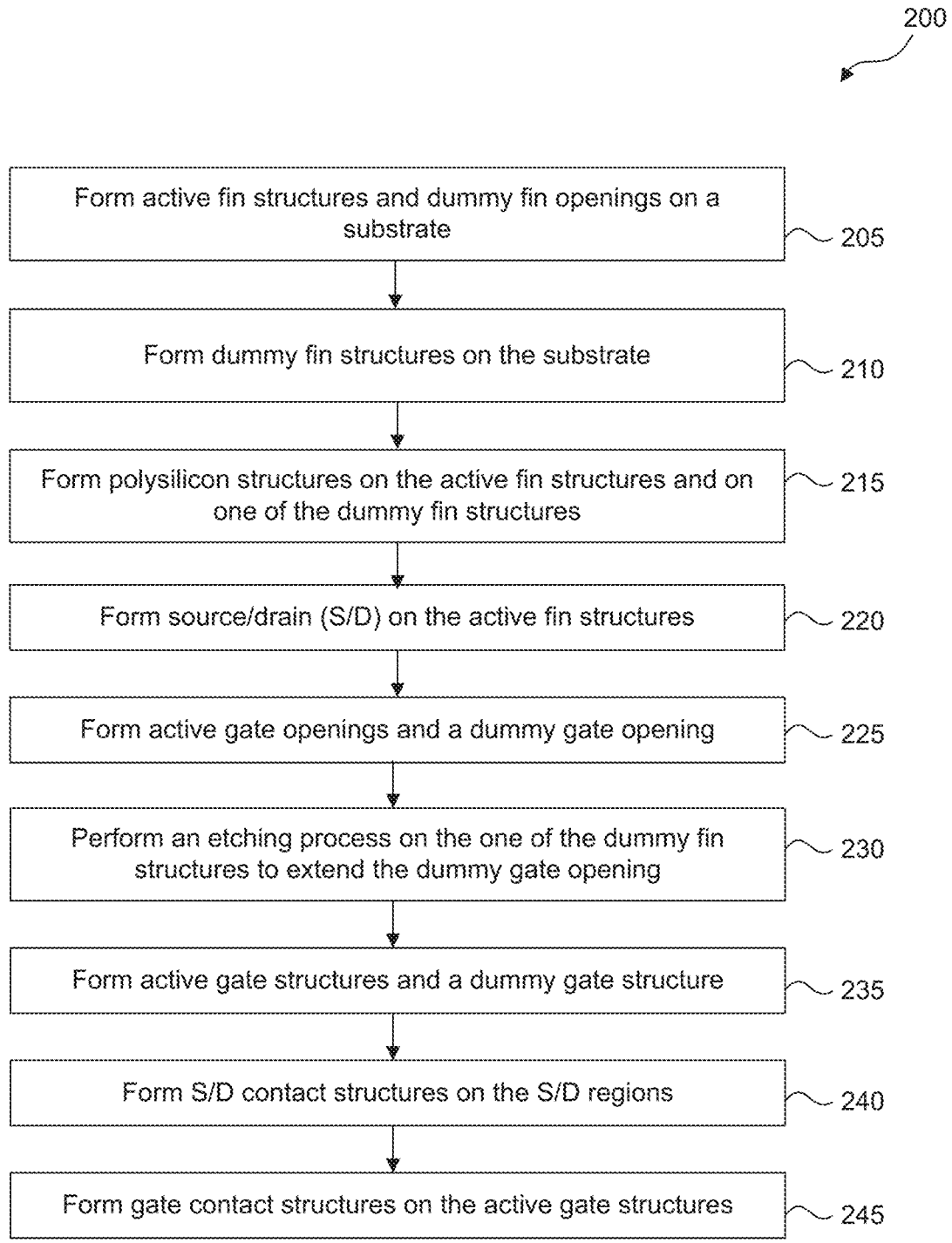
FIG. 2 is a flow diagram of a method for fabricating a semiconductor device with isolation structures, in accordance with some embodiments.

FIG. 2 is a flow diagram of an example method 200 for fabricating FET 100 with cross-sectional view shown in FIG. 1B, according to some embodiments. For illustrative purposes, the operations illustrated in FIG. 2 will be described with reference to the example fabrication process for fabricating FET 100 as illustrated in FIGS. 3-20. FIGS. 3-7 are isometric views, and FIGS. 8-20 are cross-sectional views of FET 100 along line A-A of FIG. 1A at various stages of fabrication, according to some embodiments. Operations can be performed in a different order or not performed depending on specific applications. It should be noted that method 200 may not produce a complete FET 100. Accordingly, it is understood that additional processes can be provided before, during, and after method 200, and that some other processes may only be briefly described herein. Elements in FIGS. 3-20 with the same annotations as elements in FIGS. 1A-1B are described above.

In operation 205, active fin structures and dummy fin openings are formed on a substrate. For example, as described with FIGS. 3-4, active fin structures 106A, 106B, and 106C, and dummy fin openings 415 and 419 are formed on substrate 104. The formation of active fin structures 106A, 106B, and 106C and dummy fin openings 415 and 419 can include sequential operations of (i) forming a patterned masking layer 344 on substrate 104, as shown in FIG. 3, and (ii) etching substrate 104 to form the structure of FIG. 4.

Figure 6:
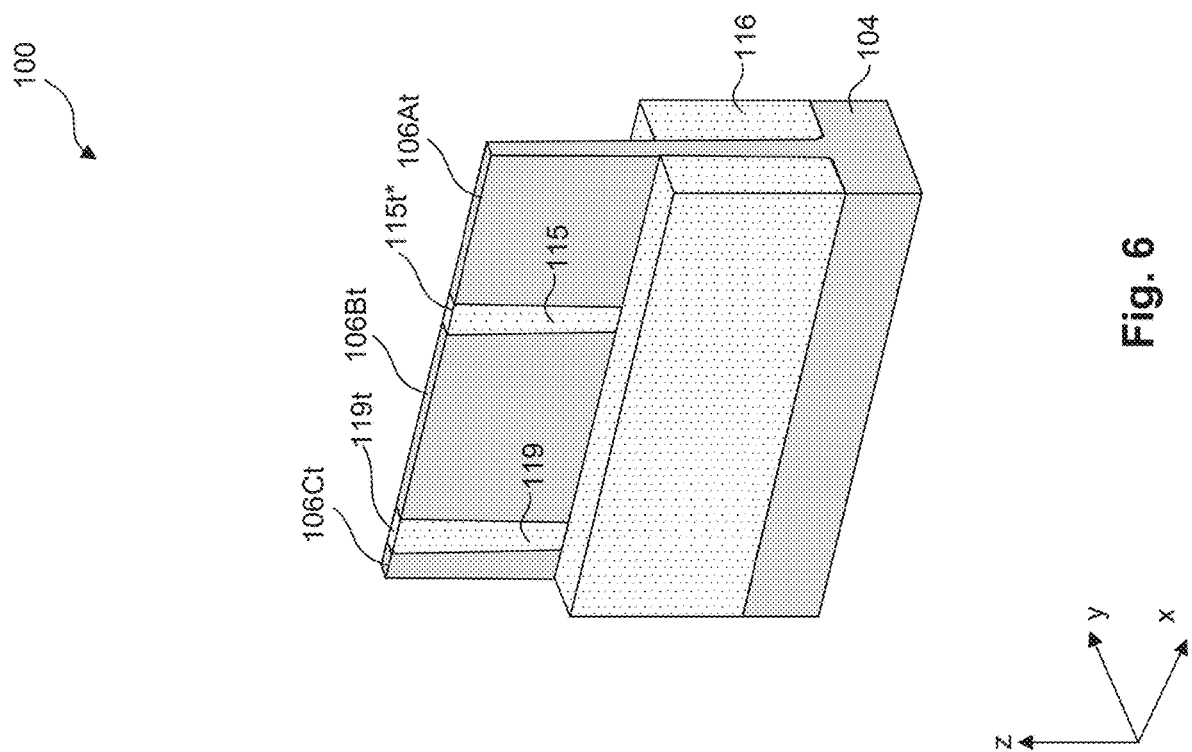
Figure 5:
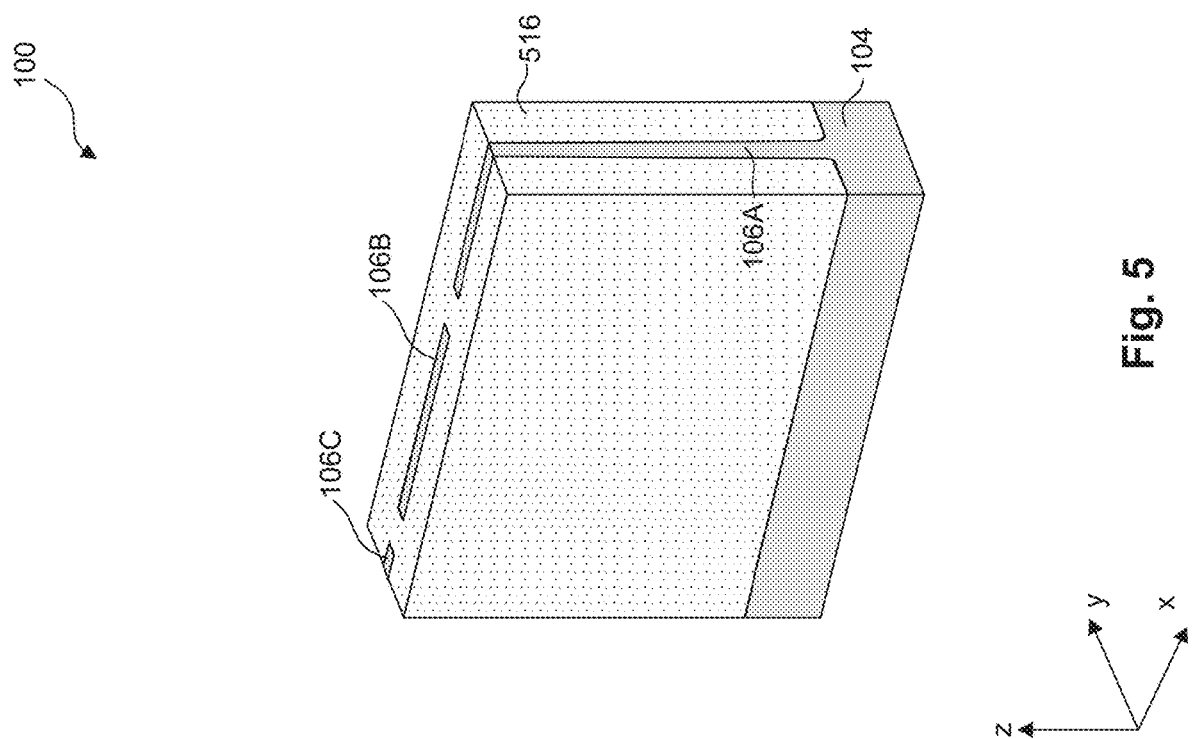

Referring to FIG. 2, in operation 210, dummy fin structures are formed on the substrate. For example, as described with reference to FIGS. 5-6, dummy fin structures 115 and 119 are formed on substrate 104. The formation of dummy fin structures 115 and 119 can include sequential operations of (i) depositing a dielectric layer 516 on the structure of FIG. 4, (ii) performing a chemical mechanical polish (CMP) on dielectric layer 516 until patterned masking layer 344 is removed and a top surface of dielectric layer 516 is substantially coplanar with top surfaces of fin structures 106A, 106B, and 106C, as shown in FIG. 5, and (iii) selectively removing portions of dielectric layer 516 from the structure of FIG. 5 by using lithographic patterning and etching processes to form the structure of FIG. 6. After the selective removal process, top surfaces 106At, 106Bt, 106Ct, 115t, and 119t are substantially coplanar with each other, as shown in FIG. 6.

In some embodiments, depositing dielectric layer 516 can include depositing a layer of silicon oxide, silicon oxycarbide (SiOC), silicon nitride (SiN), silicon carbon nitride (SiCN), or silicon oxycarbon nitride (SiOCN). In some embodiments, depositing dielectric layer 516 can include depositing a nitride liner substantially conformally on the structure of FIG. 4 and depositing an oxide fill layer on the nitride liner to fill dummy fin openings 415 and 419 and to cover the structure of FIG. 4. In some embodiments, the nitride liner can include silicon nitride or a silicon nitride-based material, and oxide fill layer can include silicon oxide or a silicon oxide-based material (e.g., silicon oxycarbide).

Figure 7:
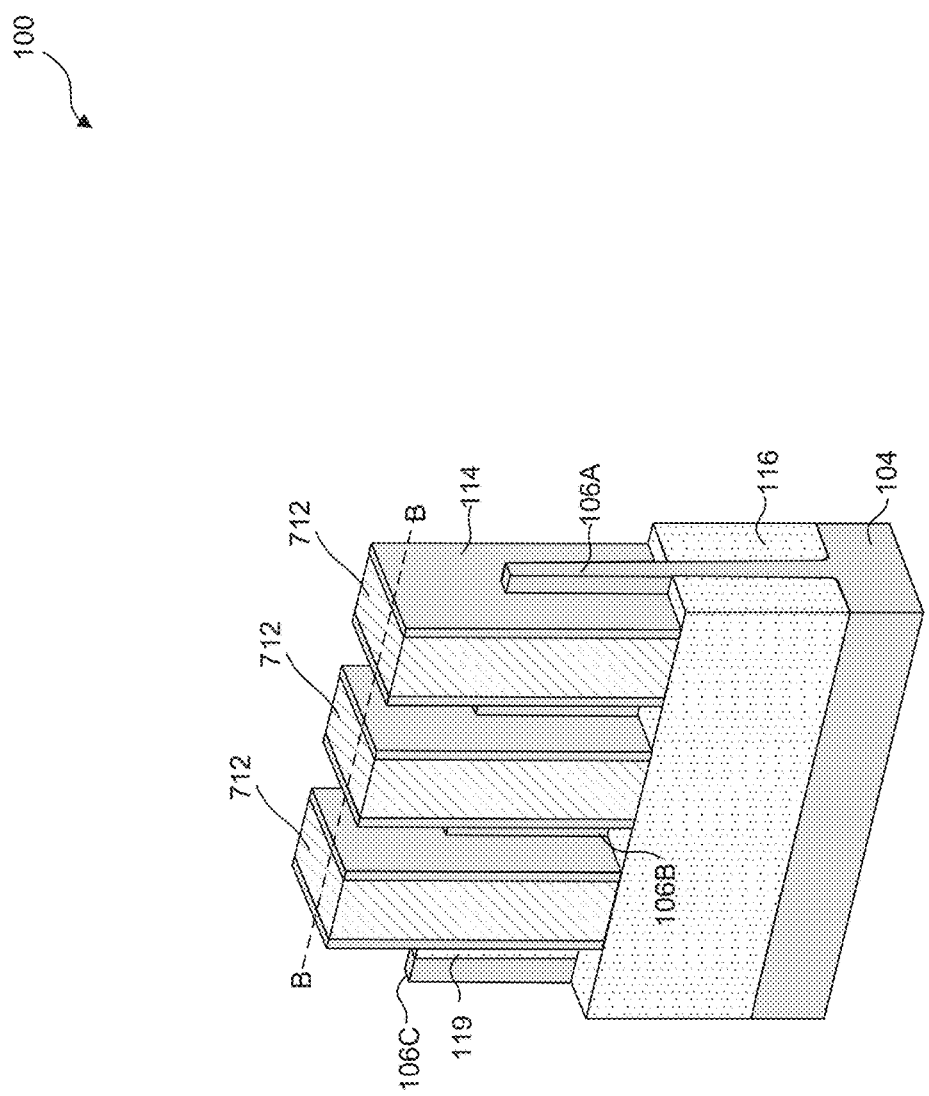
Figure 8:
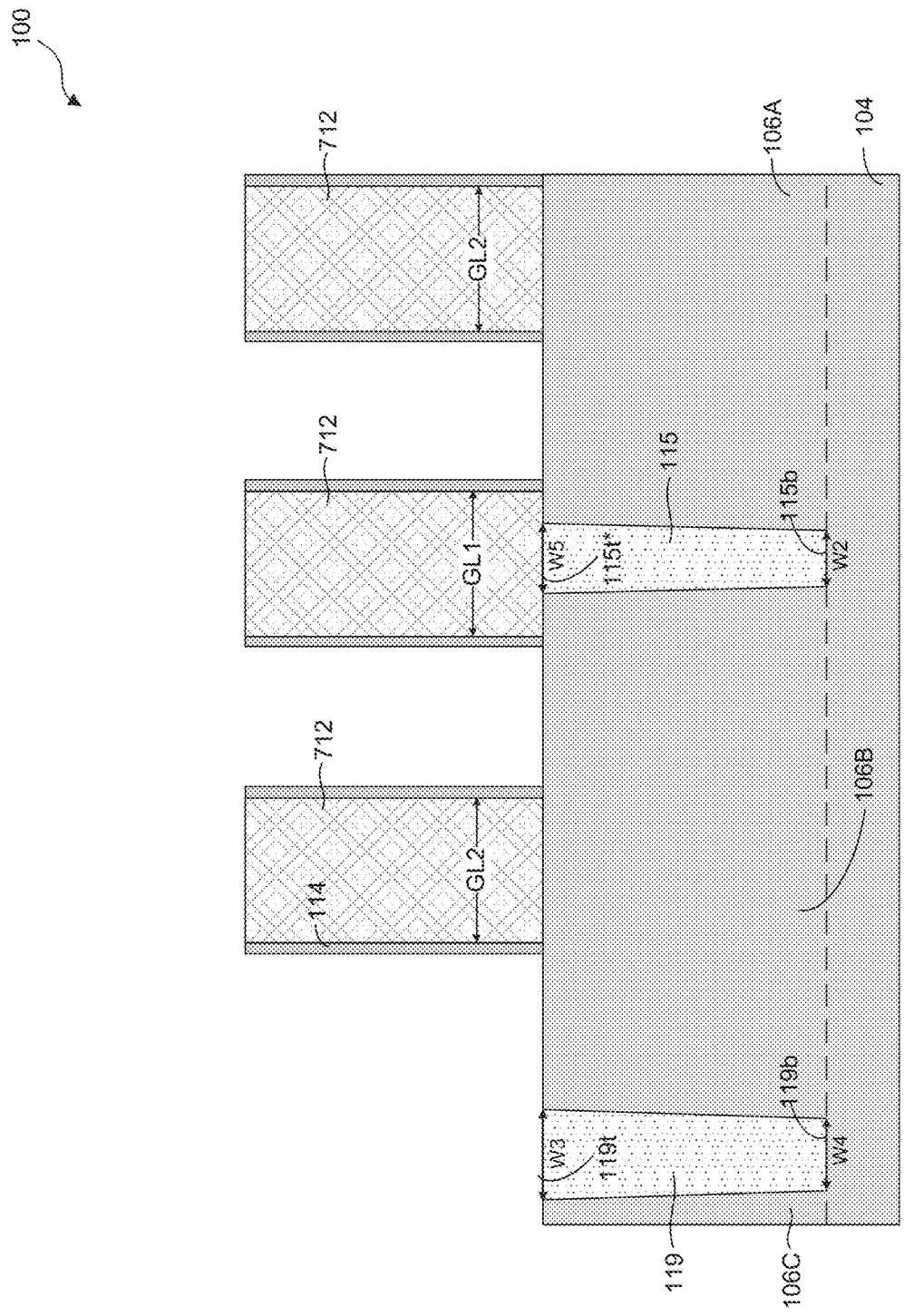

Referring to FIG. 2, in operation 215, polysilicon structures are formed on the active fin structures and on one of the dummy fin structures. For example, as shown in FIGS. 7-8, polysilicon structures 712 are formed on active fin structures 106A and 106B, and on dummy fin structure 115. FIG. 8 is a cross-sectional view of FIG. 7 along line B-B. Polysilicon structures 712 can be formed with gate lengths GL1 and GL2 that are greater than width W5 of top surface 115t* of dummy fin structure 115 and greater than width W3 of top surface 119t of dummy fin structure 119. In subsequent processing, (i) polysilicon structures 712 on fin structures 106A and 106B can be replaced with gate structures 112A and 112B, respectively, and (ii) polysilicon structure 712 on dummy fin structure 115 can be replaced with dummy gate structure 113. Gate spacers 114 can be formed after the formation of polysilicon structures 712.

Figure 9:
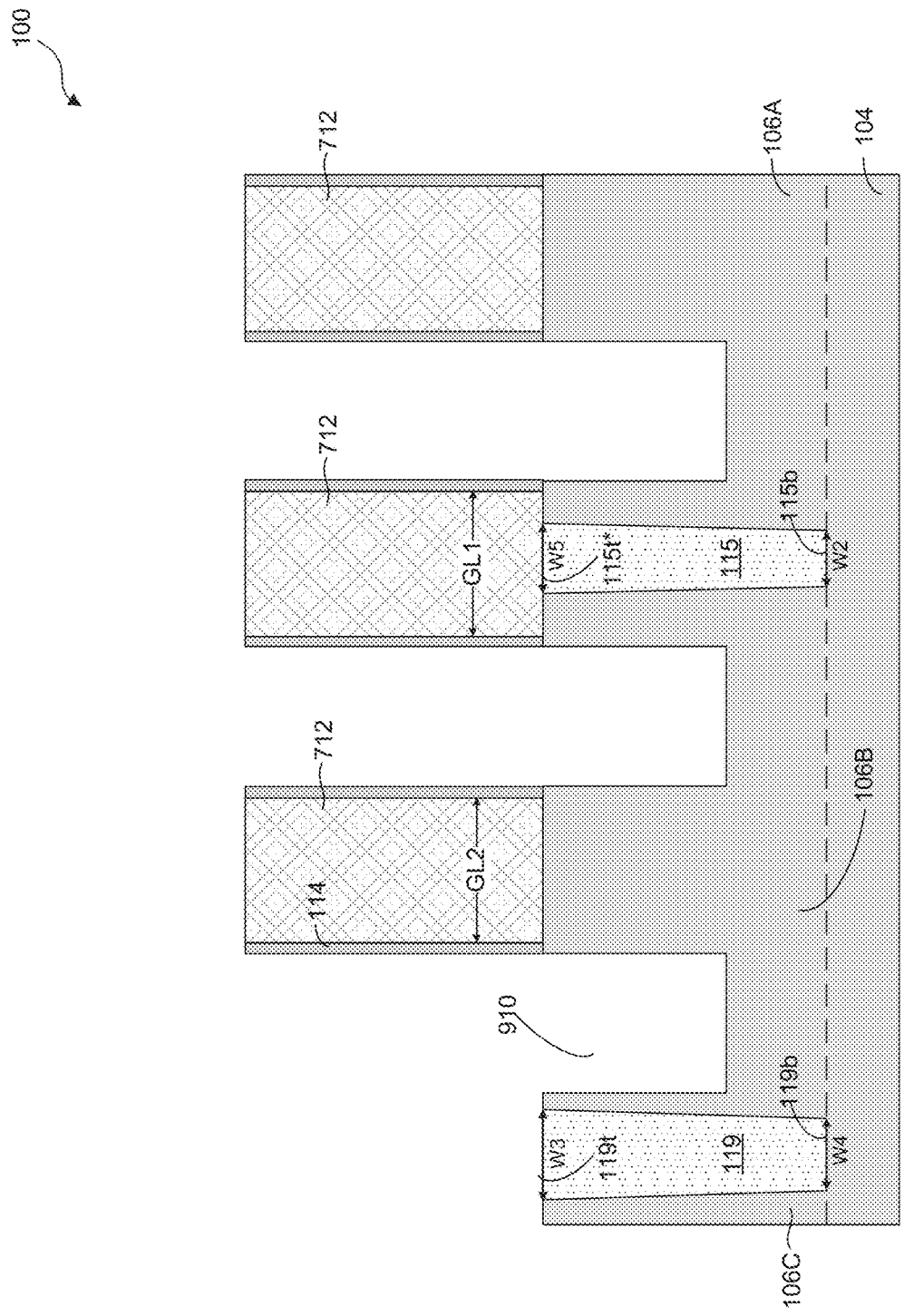
Figure 10:
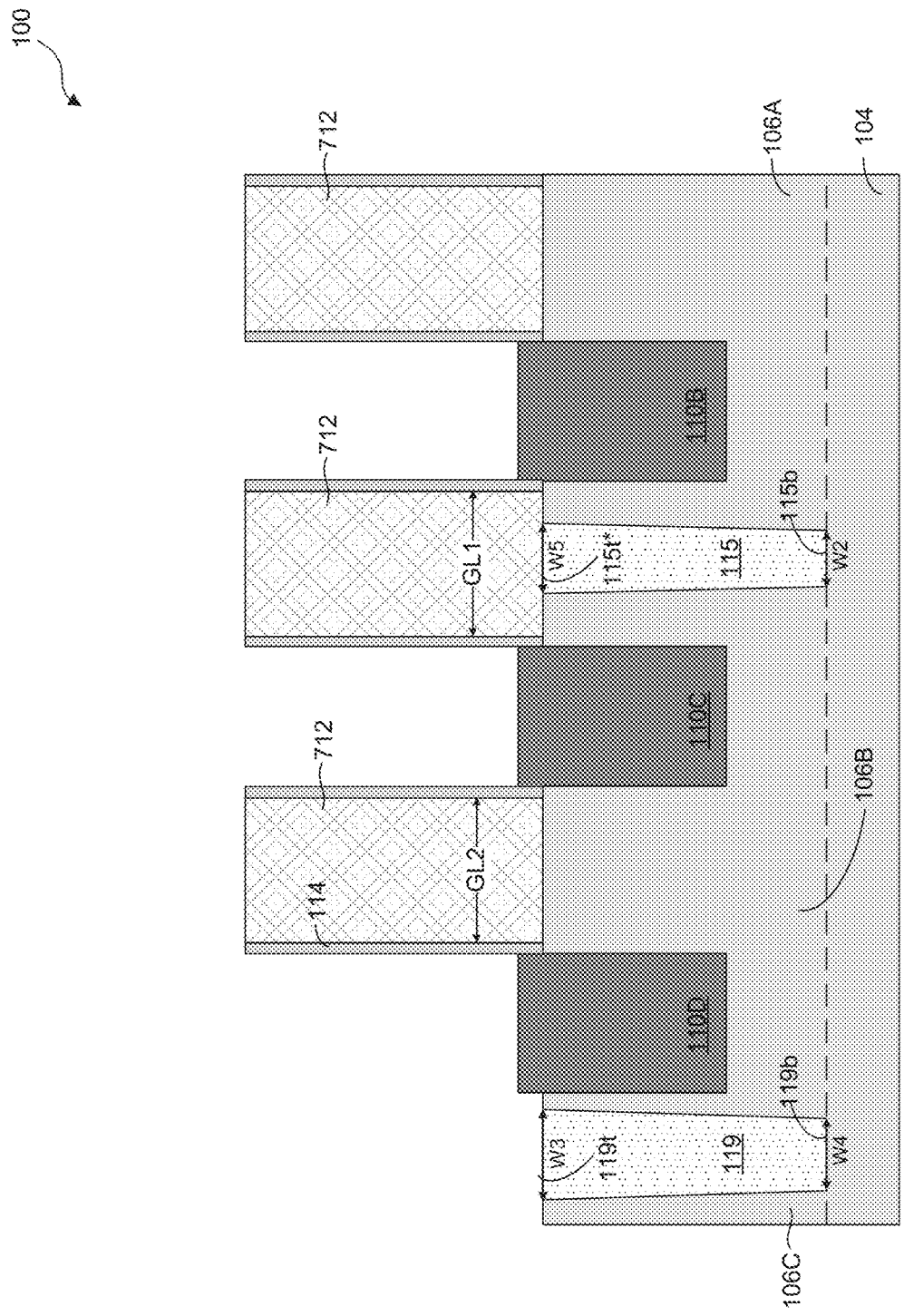
Figure 11:
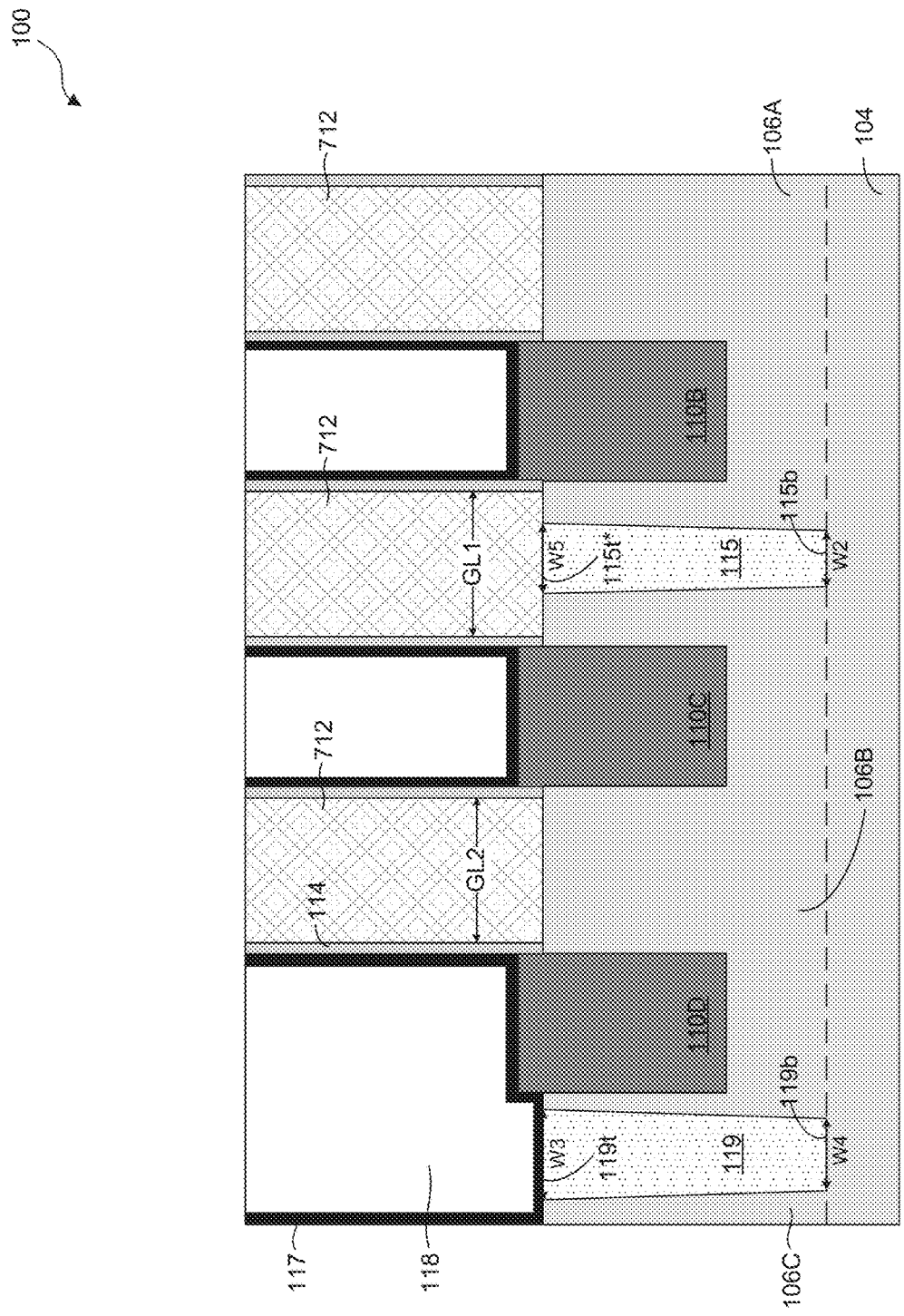

Referring to FIG. 2, in operation 220, S/D regions are formed on the active fin structures. For example, as described with reference to FIGS. 9-10, S/D regions 110B are formed on active fin structure 106A and S/D regions 110C and 110D are formed on fin structure 106B. The formation of S/D regions 110B, 110C, and 110D can include sequential operations of (i) forming S/D openings 910, as shown in FIG. 9, and (ii) epitaxially growing a semiconductor material in S/D openings 910 to form the structure of FIG. 10. After the formation of S/D regions 110B, 110C, and 110D, ESL 117 and ILD layer 118 can be formed, as shown in FIG. 11.

Figure 12:
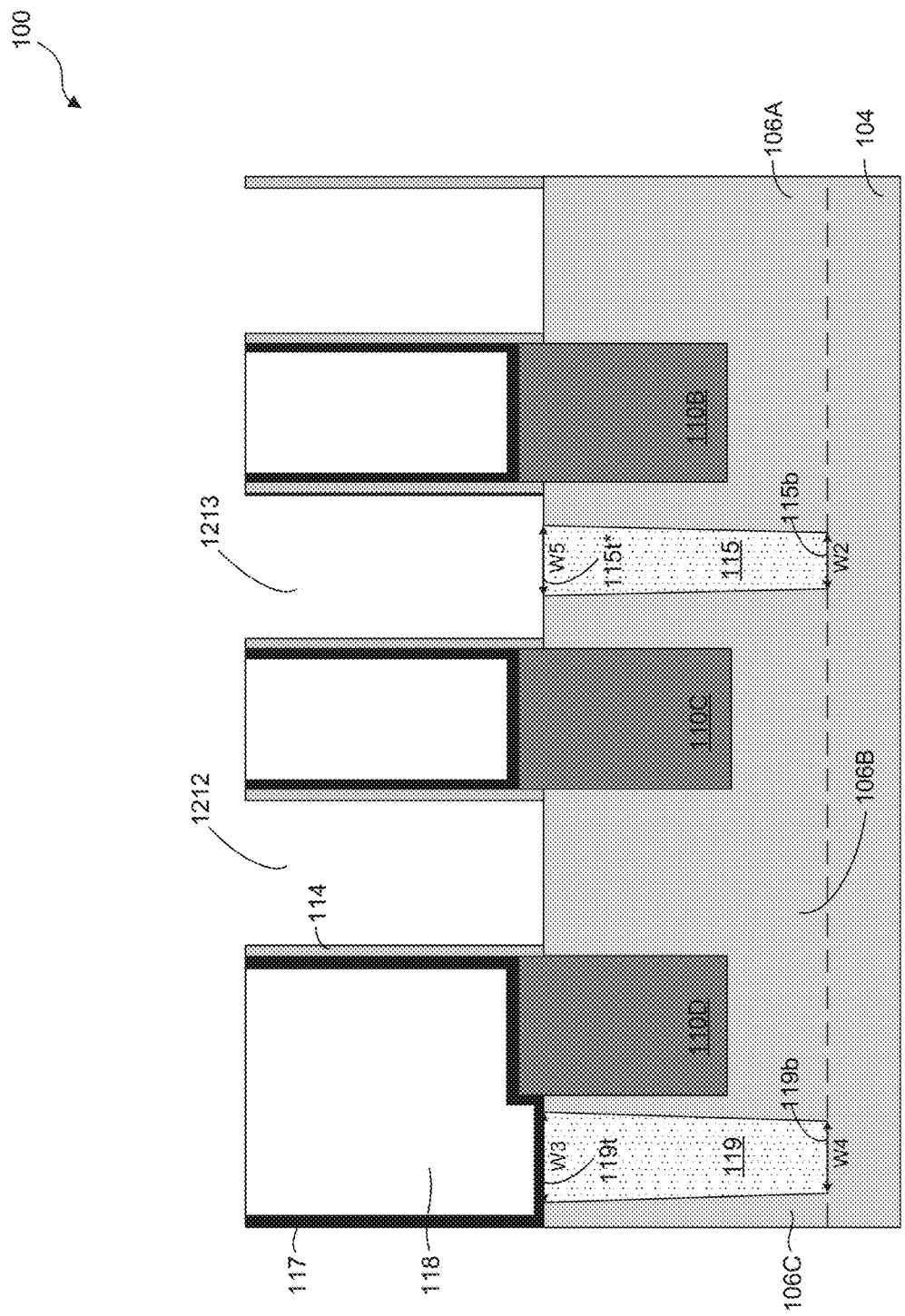

Referring to FIG. 2, in operation 225, active gate openings and a dummy gate opening are formed. For example, as shown in FIG. 12, active gate openings 1212 are formed by removing polysilicon structures 712 on fin structures 106A and 106B, and dummy gate opening 1213 is formed by removing polysilicon structure 712 on dummy fin structure 115.

Figure 13:
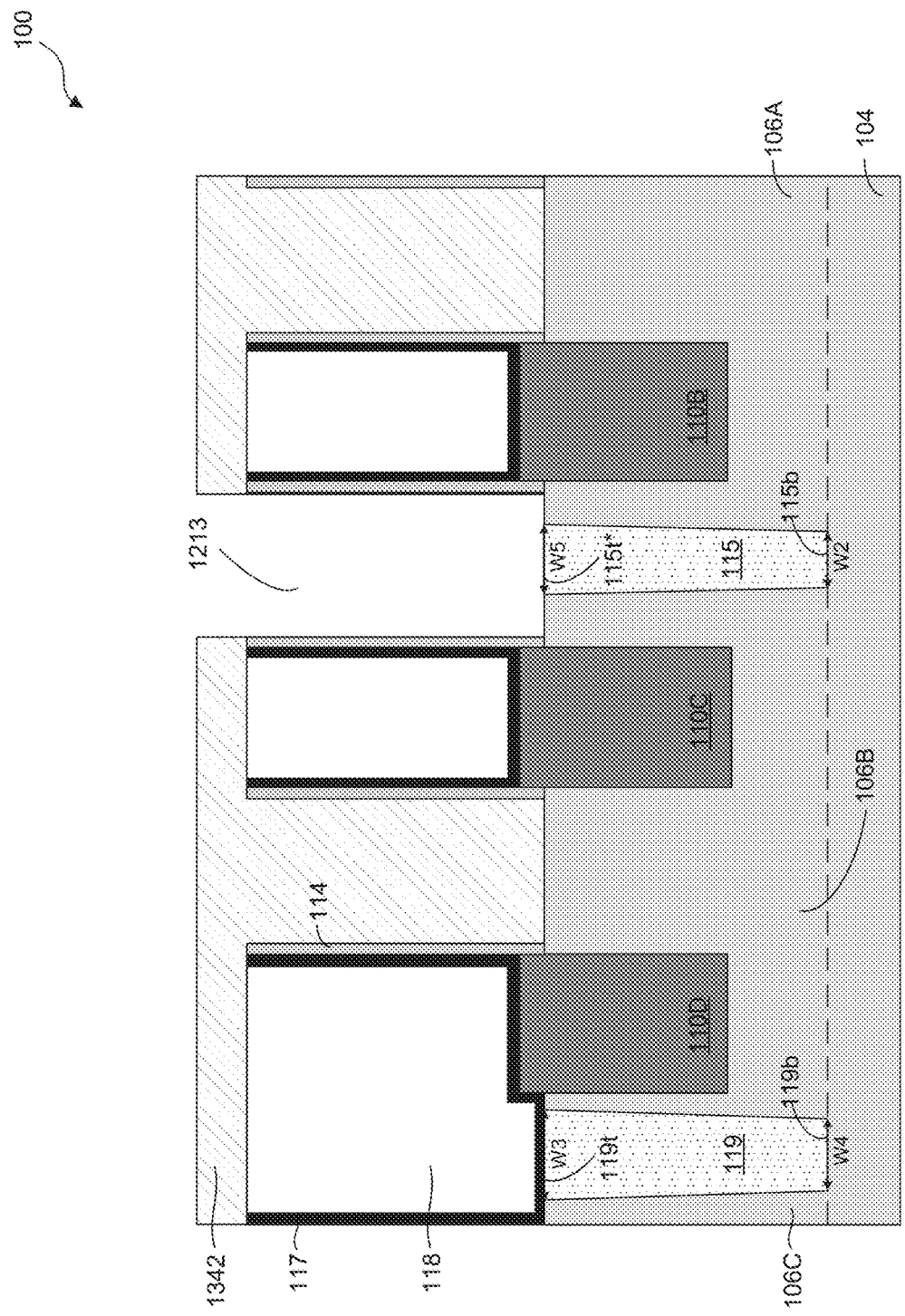
Figure 14:
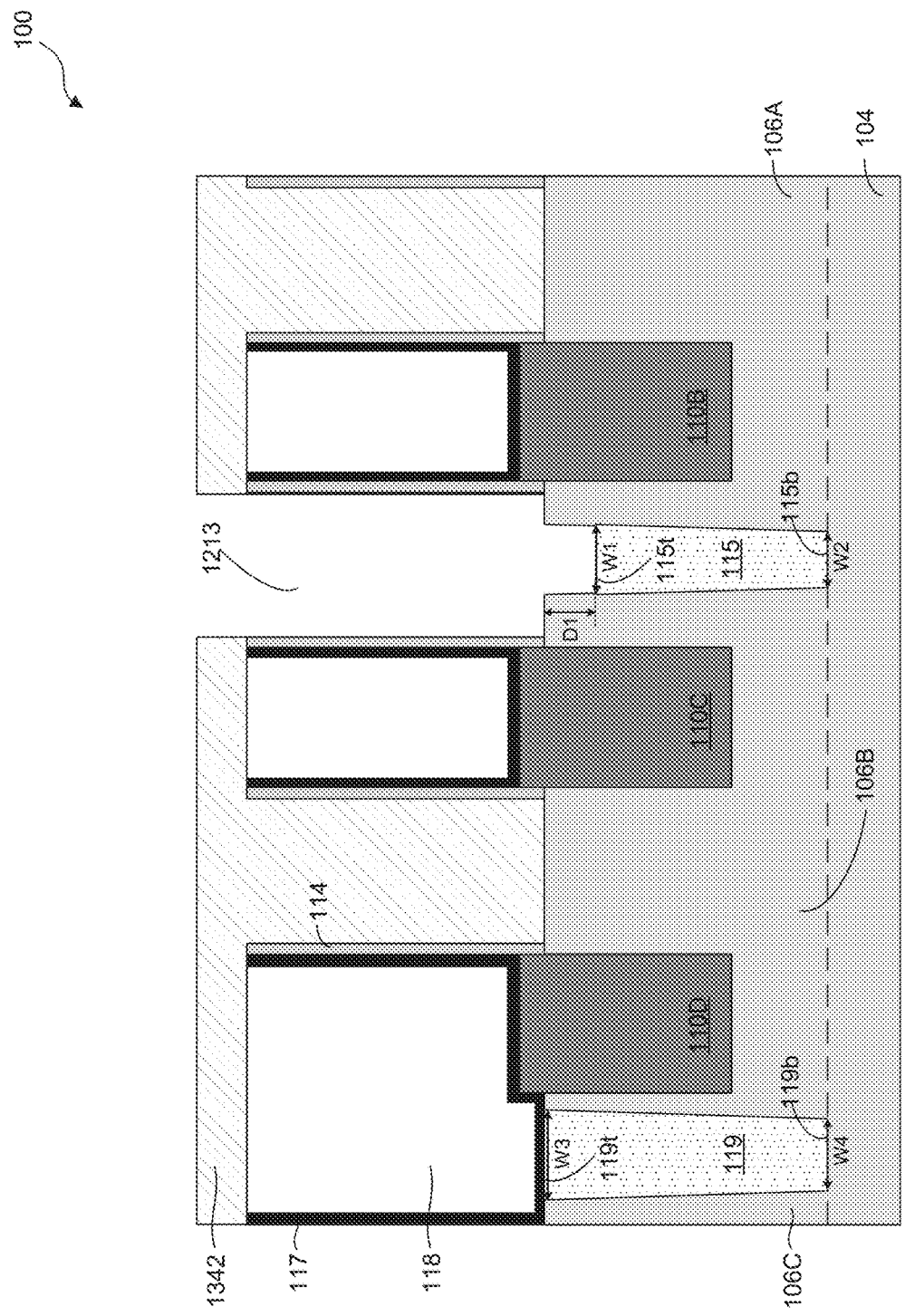

Referring to FIG. 2, in operation 230, an etching process is performed on one of the dummy fin structures to extend the dummy gate opening. For example, as described with reference to FIGS. 13-14, an etching process is performed on dummy fin structure 115 to extend dummy gate opening 1213 below top surfaces of fin structures 106A and 106B by vertical dimension D1. The etching process can include forming a patterned masking layer 1342, as shown in FIG. 13, and then performing a wet etch process on the structure of FIG. 13 to form the structure of FIG. 14. After the wet etch process, patterned masking layer 1342 can be removed.

Figure 15:
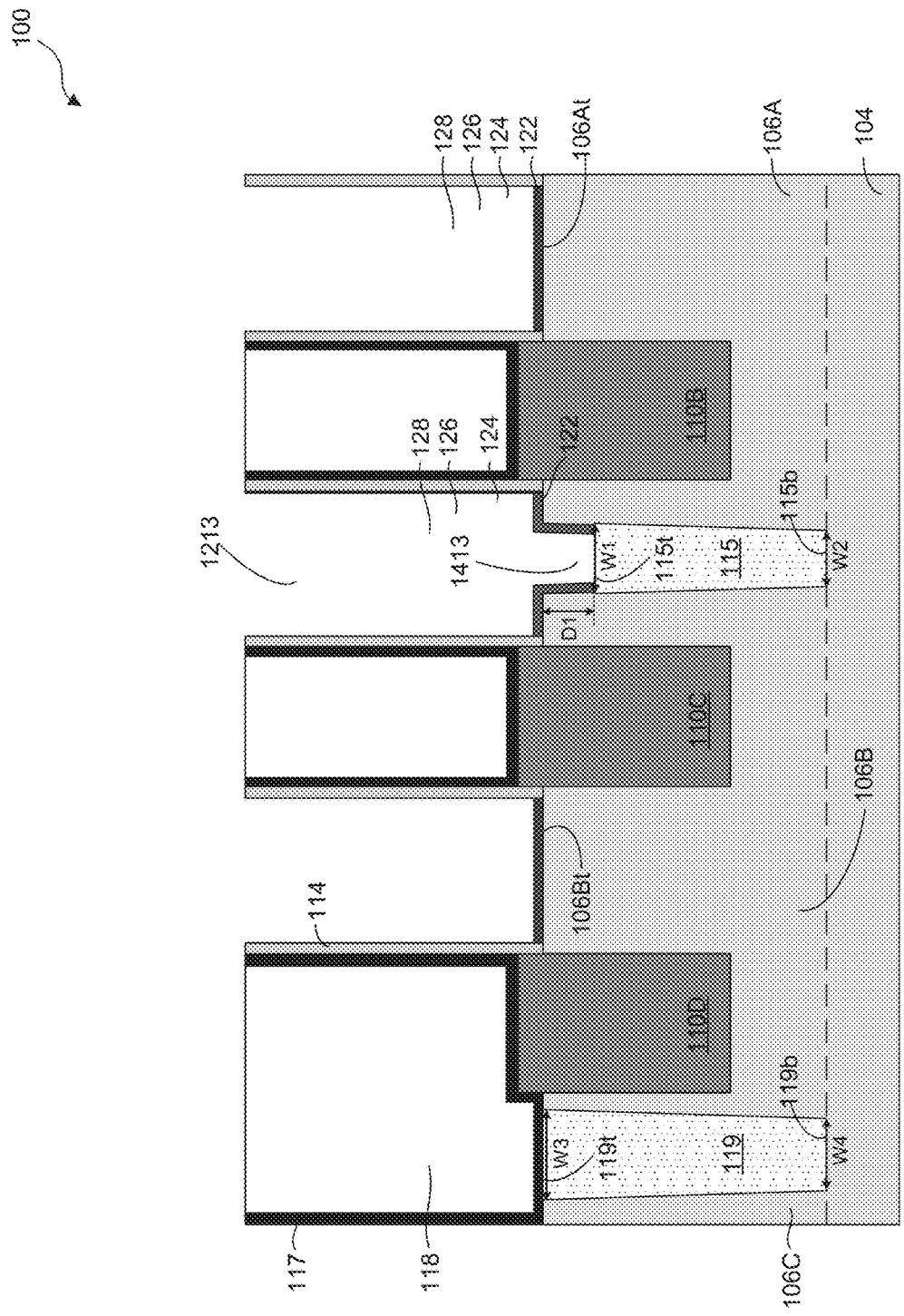
Figure 16:
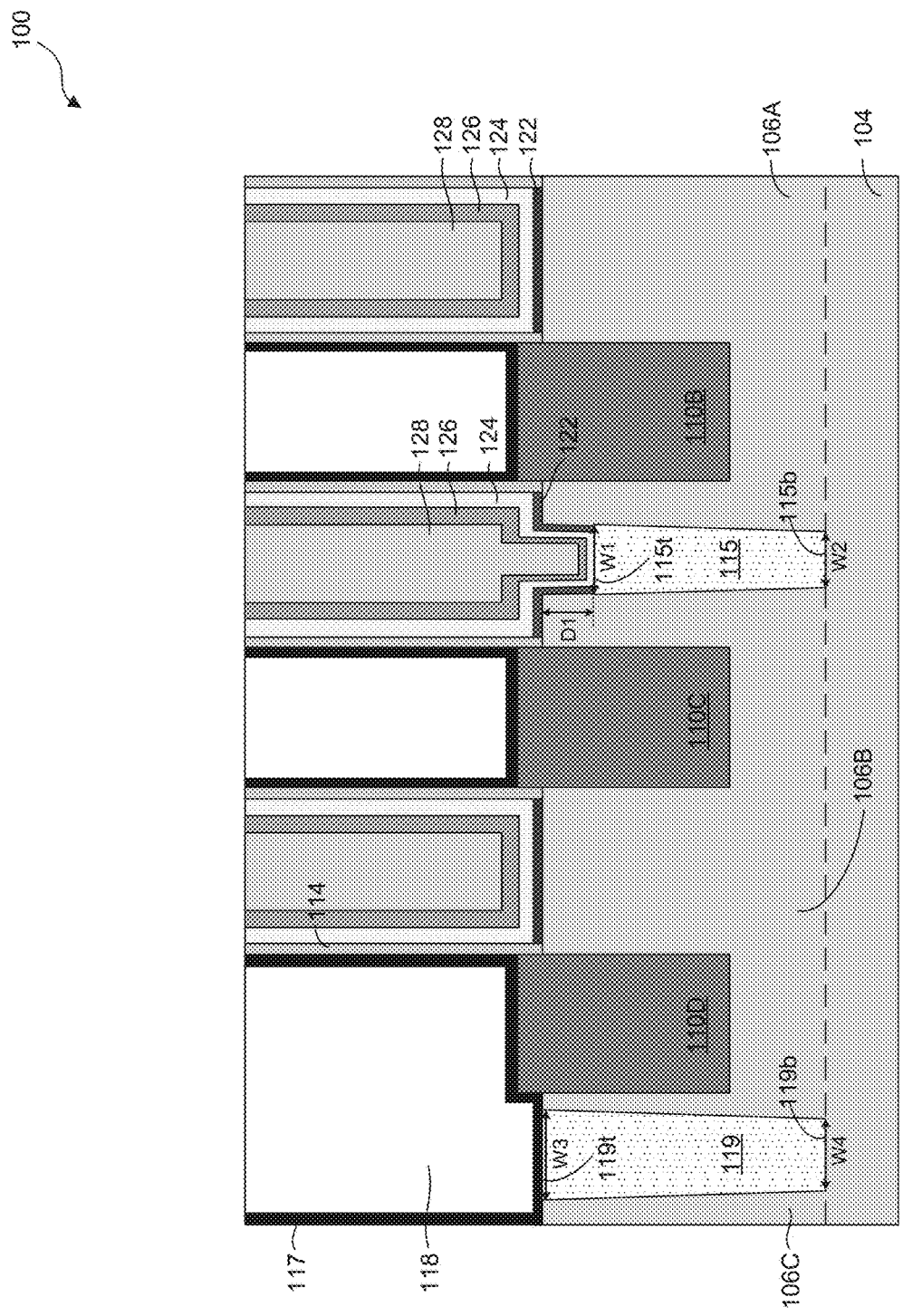
Figure 17:
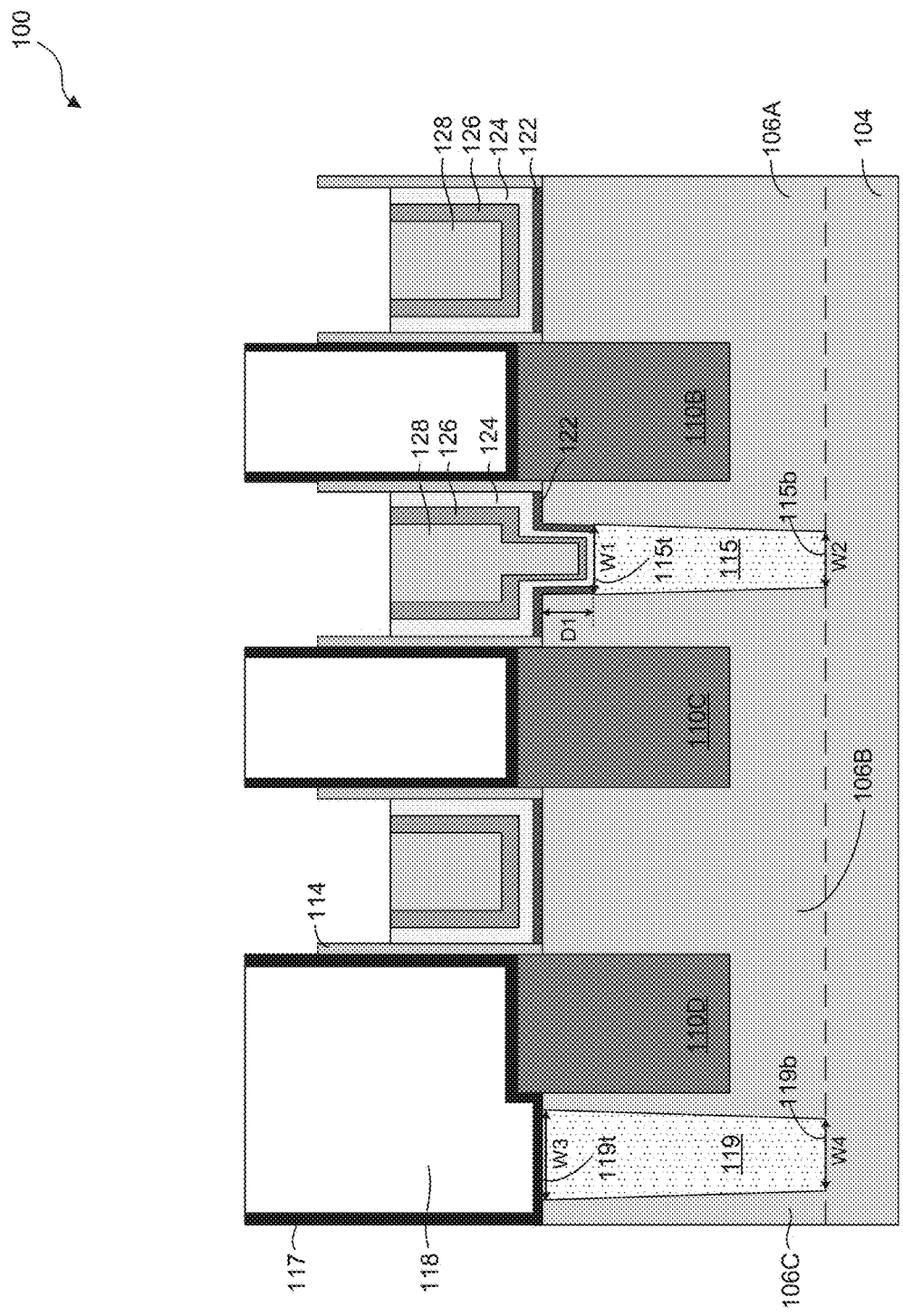
Figure 18:
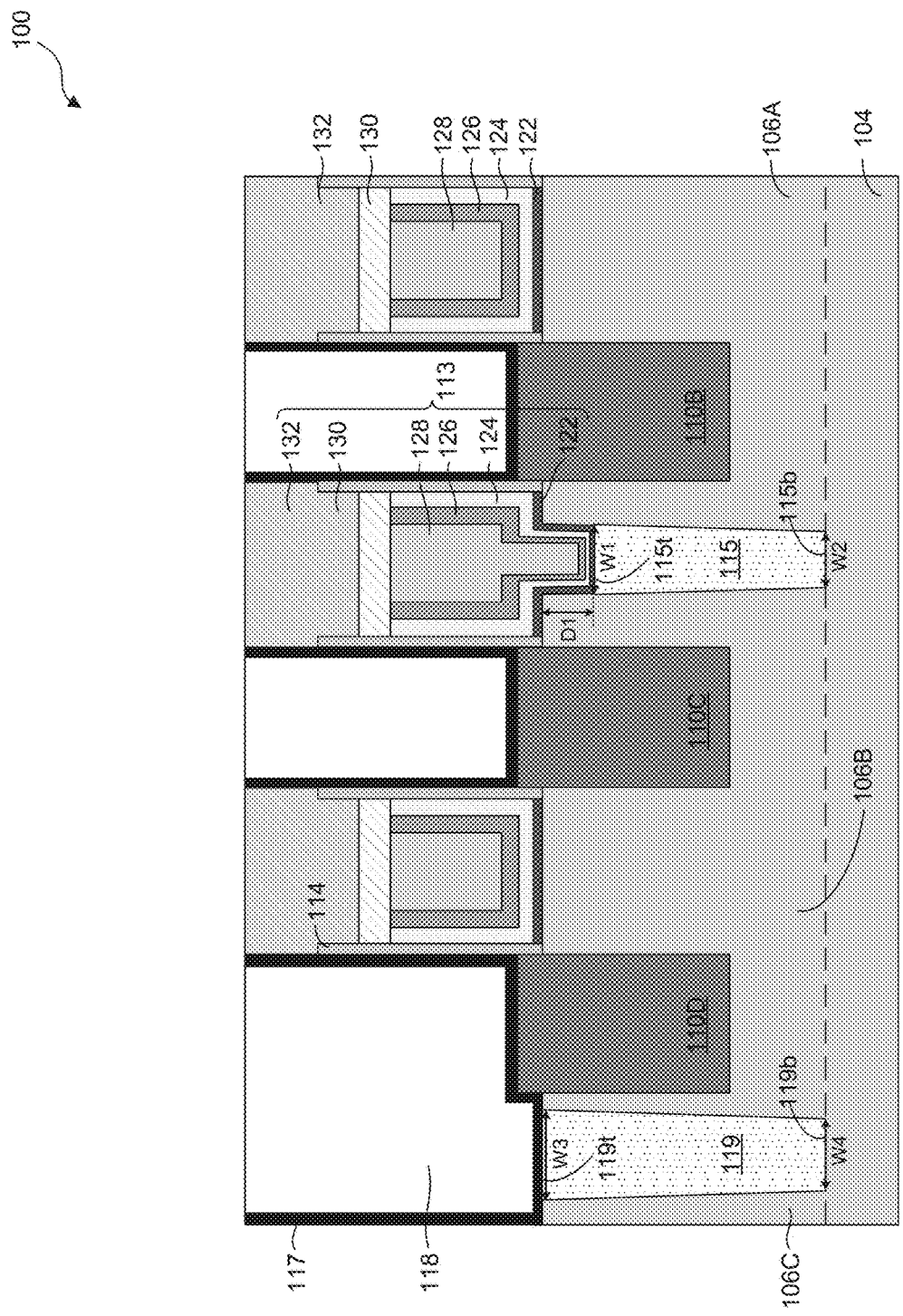

Referring to FIG. 2, in operation 235, active gate structures and a dummy gate structure is formed. For example, as described with reference to FIGS. 15-18, active gate structures 112A and 112B are formed on fin structures 106A and 106B, and dummy gate structure 113 is formed on dummy fin structure 115. In some embodiments, gate structures 112A and 112B and dummy gate structure 113 can be formed at the same time. The formation of gate structures 112A and 112B and dummy gate structure 113 can include sequential operations of (i) forming IO layers 122, as shown in FIG. 15, by oxidizing sidewalls and top surfaces 106At and 106Bt of fin structures 106A and 106B, (ii) depositing a HK gate dielectric layer on the structure of FIG. 15, (iii) depositing a WFM layer on the HK gate dielectric layer, (iv) depositing a gate metal fill layer on the WFM layer, (v) performing a CMP process on the HK gate dielectric layer, WFM layer, and the gate metal fill layer to form the structure of FIG. 16, (vi) etching gate spacers 114, HK gate dielectric layers 124, WFM layers 126, and gate metal fill layers, as shown in FIG. 17, (vii) forming conductive capping layers 130 on HK gate dielectric layers 124, WFM layers 126, and gate metal fill layers, as shown in FIG. 18, and (viii) forming insulating capping layers 132 on conductive capping layers 130, as shown in FIG. 18.

Figure 19:
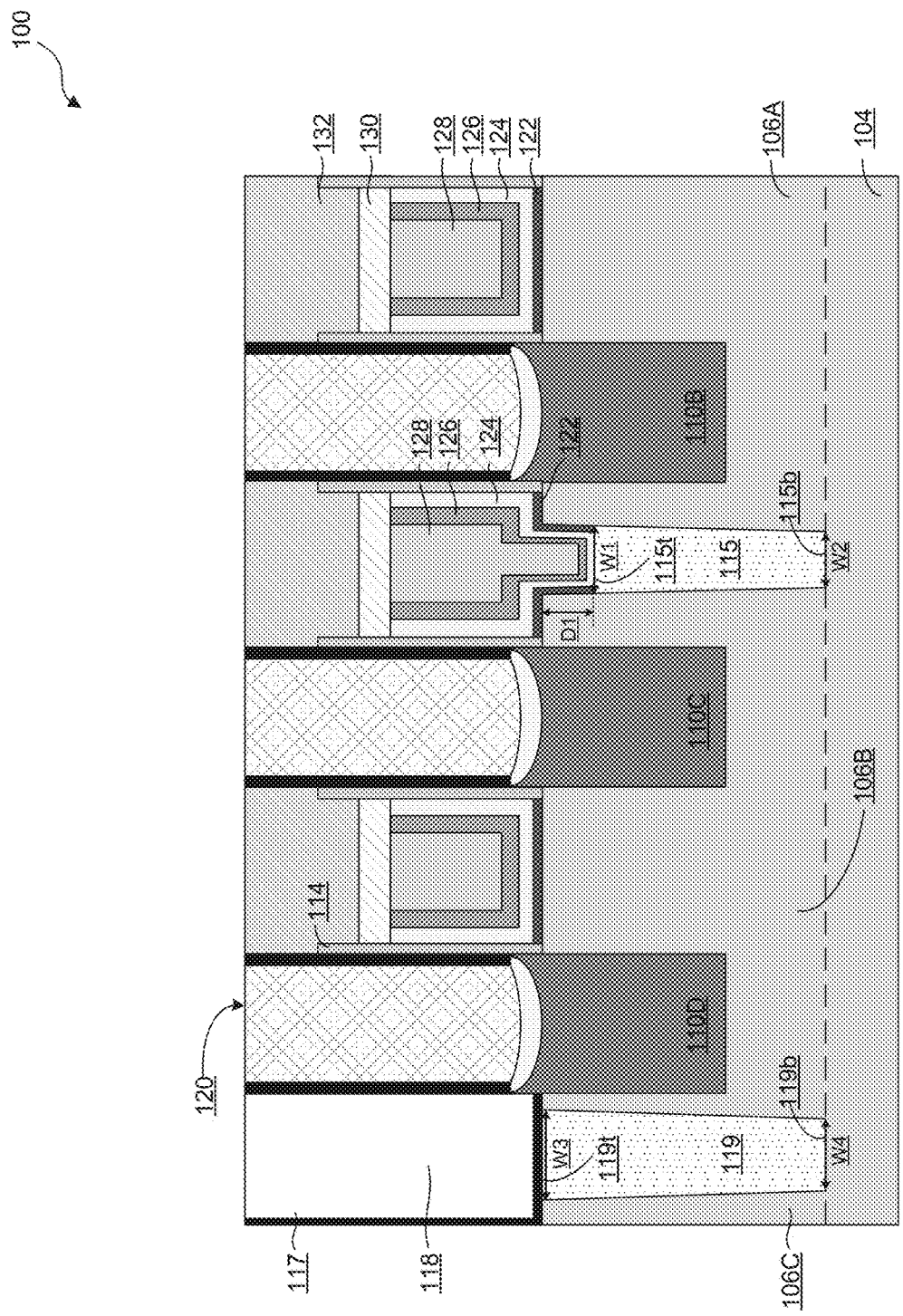

Referring to FIG. 2, in operation 240, S/D contact structures are formed on the S/D regions. For example, as shown in FIG. 19, S/D contact structures 120 are formed on S/D regions 110B, 110C, and 110D.

Figure 20:
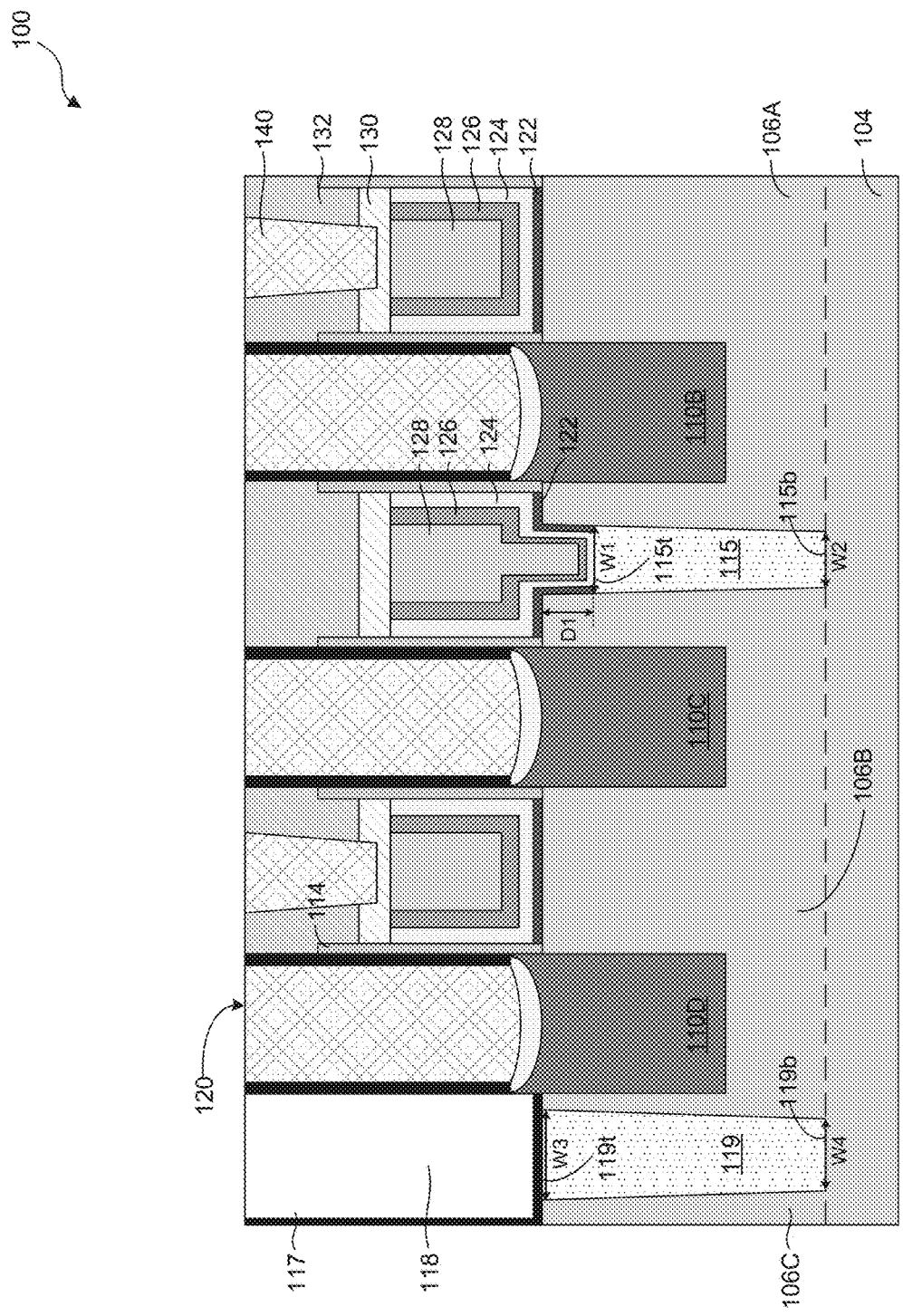

Referring to FIG. 2, in operation 245, gate contact structures are formed on the active gate structures. For example, as shown in FIG. 20, gate contact structures 140 are formed on active gate structures 112A and 112B.

The present disclosure provides example structures of FETs (e.g., FET 100) with different isolation structures (e.g., isolation structures 108 and 119) and example methods of forming the same. In some embodiments, a FET includes active fin structures (e.g., fin structures 106A-106C), active gate structures (e.g., gate structures 112A-112B) on the active fin structures, and isolation structures configured to electrically isolate the active fin structures. In some embodiments, an isolation structure (e.g., isolation structure 108) includes a dummy fin structure (e.g., dummy fin structure 115) and a dummy gate structure (e.g., dummy gate structure 113) on the dummy fin structure. The dummy fin structure includes a dielectric material and is interposed between active fin structures (e.g., fin structures 106A-106B). The dummy gate structure includes a gate stack similar to the gate stacks of the active gate structures and a portion (e.g., bottom gate portion 113b) of the dummy gate structure extends into the dummy fin structure. The extended portion of the dummy gate structure can prevent the dummy fin structure from being etched during processing of adjacent structures, such as contact structures (e.g., S/D contact structures 120). In some embodiments, the dummy gate structure is formed with a gate length (e.g., gate length GL1) that is greater than the width (e.g., width W1) of the dummy fin structure to prevent misalignment between the dummy gate structure and the dummy fin structure. Preventing misalignment between the dummy gate structure and the dummy fin structure can prevent the metal gate stack of the dummy gate structure from being exposed and forming an electrical short between the metal gate stack and adjacent structures, such as source/drain regions of the FET. In some embodiments, to prevent the misalignment, the dummy gate structure is formed with a gate length that is about 1.1 times to about 1.5 times the width of the dummy fin structure.

In some embodiments, a method includes forming first and second fin structures on a substrate, forming a dummy fin structure on the substrate and between the first and second fin structures, forming a polysilicon structure on the dummy fin structure, forming source/drain regions on the first and second fin structures, and replacing the polysilicon structure with a dummy gate structure. A top portion of the dummy gate structure is formed wider than a bottom portion of the dummy gate structure.

In some embodiments, a method includes forming first and second fin structures on a substrate, forming first and second dielectric fin structures on the substrate, forming first and second gate structures on the first and second fin structures, respectively, forming a dummy gate structure on the first dielectric fin structure with a gate length greater than a width of the first dielectric fin structure, and forming contact structures on the first and second gate structures.

In some embodiments, a semiconductor device includes a substrate, first and second fin structures disposed on the substrate, a dummy fin structure disposed between the first and second fin structure, source/drain regions disposed in the first and second fin structures, first and second gate structures disposed on the first and second fin structures, respectively, and a dummy gate structure disposed on the dummy fin structure. A gate length of the dummy gate structure is greater than a width of the dummy fin structure and substantially equal to gate lengths of the first and second gate structures.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming first and second fin structures on a substrate;
    forming a dummy fin structure on the substrate and between the first and second fin structures;
    forming a polysilicon structure on the dummy fin structure;
    forming source/drain regions on the first and second fin structures; and
    replacing the polysilicon structure with a dummy gate structure, wherein a top portion of the dummy gate structure is formed wider than a bottom portion of the dummy gate structure.

2. The method of claim 1, wherein forming the dummy fin structure comprises forming a fin opening between the first and second fin structures.

3. The method of claim 1, wherein forming the dummy fin structure comprises forming a dielectric layer between the first and second fin structures.

4. The method of claim 1, wherein forming the dummy fin structure comprises forming a top surface of the dummy fin structure substantially coplanar with top surfaces of the first and second fin structures.

5. The method of claim 1, wherein forming the polysilicon structure comprises forming the polysilicon structure with a gate length greater than a width of the dummy fin structure.

6. The method of claim 1, wherein replacing the polysilicon structure with the dummy gate structure comprises forming the bottom portion of the dummy gate structure between the first and second fin structures and on the dummy fin structure.

7. The method of claim 1, wherein replacing the polysilicon structure with the dummy gate structure comprises etching a portion of the dummy fin structure.

8. The method of claim 1, wherein replacing the polysilicon structure with the dummy gate structure comprises oxidizing sidewalls and top surfaces of the first and second fin structures.

9. The method of claim 1, wherein replacing the polysilicon structure with the dummy gate structure comprises forming an opening that extends below top surfaces of the first and second fin structures.

10. The method of claim 1, wherein replacing the polysilicon structure with the dummy gate structure comprises forming the bottom portion of the dummy gate structure with a width substantially equal to a width of the dummy fin structure.

11. A method, comprising:
    forming first and second fin structures on a substrate;
    forming first and second dielectric fin structures on the substrate;
    forming first and second gate structures on the first and second fin structures, respectively;
    forming a dummy gate structure in physical contact with a top surface and along sidewalls of the first dielectric fin structure; and
    forming contact structures on the first and second gate structures.

12. The method of claim 11, wherein forming the first and second dielectric fin structures comprises forming top surfaces of the first and second dielectric fin structures substantially coplanar with top surfaces of the first and second fin structures.

13. The method of claim 11, wherein forming the first and second dielectric fin structures comprises forming the first dielectric fin structure with a width smaller than a width of the second dielectric fin structure.

14. The method of claim 11, wherein forming the dummy gate structure comprises forming a top portion of the dummy gate structure about 1.1 times to about 1.5 times wider than a bottom portion of the dummy gate structure.

15. The method of claim 11, wherein forming the dummy gate structure comprises:
    etching a top portion of the first dielectric fin structure; and
    exposing sidewalls of the first and second fin structures.

16. The method of claim 11, further comprising forming an interlayer dielectric (ILD) layer on the second dielectric fin structure.

17. A method, comprising:
    forming a semiconductor fin structure on a substrate;
    forming a dielectric fin structure adjacent to the semiconductor fin structure;
    forming first and second polysilicon structures on the semiconductor fin structure and the dielectric fin structure, respectively;
    epitaxially growing a source/drain region in the semiconductor fin structure and between the first and second polysilicon structures;
    replacing the first polysilicon structure with a gate structure; and
    replacing the second polysilicon structure with a dummy gate structure comprising a gate length greater than a width of the dielectric fin structure and substantially equal to a gate length of the gate structure.

18. The method of claim 17, wherein forming the dielectric fin structure comprises forming the dielectric fin structure with a top surface non-coplanar with a top surface of the semiconductor fin structure.

19. The method of claim 17, wherein replacing the first polysilicon structure and replacing the second polysilicon structure are performed at different time periods.

20. The method of claim 17, wherein replacing the second polysilicon structure with the dummy gate structure comprises etching a portion of the dielectric fin structure.

* * * * *

UNITED STATES PATENT AND TRADEMARK OFFICE
CERTIFICATE OF CORRECTION

| | | |
|---|---|---|
| PATENT NO. | : 12,349,383 B2 | Page 1 of 1 |
| APPLICATION NO. | : 17/738955 | |
| DATED | : July 1, 2025 | |
| INVENTOR(S) | : Chen et al. | |

It is certified that error appears in the above-identified patent and that said Letters Patent is hereby corrected as shown below:

On the Title Page

Column 1, Item (73), in "Assignee", Line 2, delete "Ltd." and insert -- Ltd., Hsinchu (TW) --, therefor.

In the Specification

In Column 8, Line 53, delete "115t," and insert -- 115t*, --, therefor.

Signed and Sealed this
Eighteenth Day of November, 2025

John A. Squires
*Director of the United States Patent and Trademark Office*